United States Patent [19]

Vig et al.

[11] Patent Number: 5,781,005
[45] Date of Patent: Jul. 14, 1998

[54] HALL-EFFECT FERROMAGNETIC-ARTICLE-PROXIMITY SENSOR

[75] Inventors: Ravi Vig; Teri L. Tu, both of Bow, N.H.

[73] Assignee: Allegro Microsystems, Inc., Worcester, Mass.

[21] Appl. No.: 485,697

[22] Filed: Jun. 7, 1995

[51] Int. Cl.[6] .................. G01P 3/48; G01P 3/54; G01B 7/14
[52] U.S. Cl. .................... 324/207.2; 324/207.25
[58] Field of Search ............. 324/207.2, 207.21, 324/207.25, 174, 251, 252, 207.24; 338/32 R, 32 H; 384/448

[56] References Cited

U.S. PATENT DOCUMENTS

| | | |
|---|---|---|
| 3,243,692 | 3/1966 | Hiessmeier et al. ............ 324/207.2 |
| 3,636,767 | 1/1972 | Duffy . |
| 3,761,751 | 9/1973 | Fink et al. . |
| 4,011,476 | 3/1977 | Beard . |
| 4,119,911 | 10/1978 | Johnson, Jr. ................. 324/207.24 |
| 4,207,519 | 6/1980 | Zatsepin et al. . |
| 4,293,814 | 10/1981 | Boyer ......................... 324/207.25 |
| 4,311,981 | 1/1982 | Luzynski . |
| 4,443,716 | 4/1984 | Avery . |
| 4,482,849 | 11/1984 | Doemen et al. . |
| 4,518,918 | 5/1985 | Avery . |
| 4,535,289 | 8/1985 | Abe et al. .................... 324/235 |
| 4,700,133 | 10/1987 | Day .......................... 324/174 |
| 4,785,242 | 11/1988 | Vaidya et al. ................ 324/207.25 |
| 4,841,243 | 6/1989 | Bishop et al. ................ 324/174 |
| 4,859,941 | 8/1989 | Higgs et al. . |
| 4,935,698 | 6/1990 | Kawaji et al. . |
| 4,967,153 | 10/1990 | Langly ....................... 324/174 |
| 5,045,920 | 9/1991 | Vig et al. . |
| 5,229,715 | 7/1993 | Miino et al. ................. 324/207.15 |
| 5,497,082 | 3/1996 | Hancock ...................... 324/207.21 |
| 5,514,961 | 5/1996 | Stoll et al. .................. 324/207.24 |

Primary Examiner—Walter E. Snow

[57] ABSTRACT

A Hall-effect sensor is presented which is adapted to sense a ferromagnetic object, including an integrated circuit chip having a planar Hall element which is positioned in, parallel to, and defines a sensor plane having a front side and a back side, and which element is normal to and centered on a sensor axis, and a magnet structure having an N pole and an S pole, the magnet structure being positioned behind the sensor plane and positioned so that an S pole and an N pole are adjacent each other and both are adjacent the element.

14 Claims, 24 Drawing Sheets

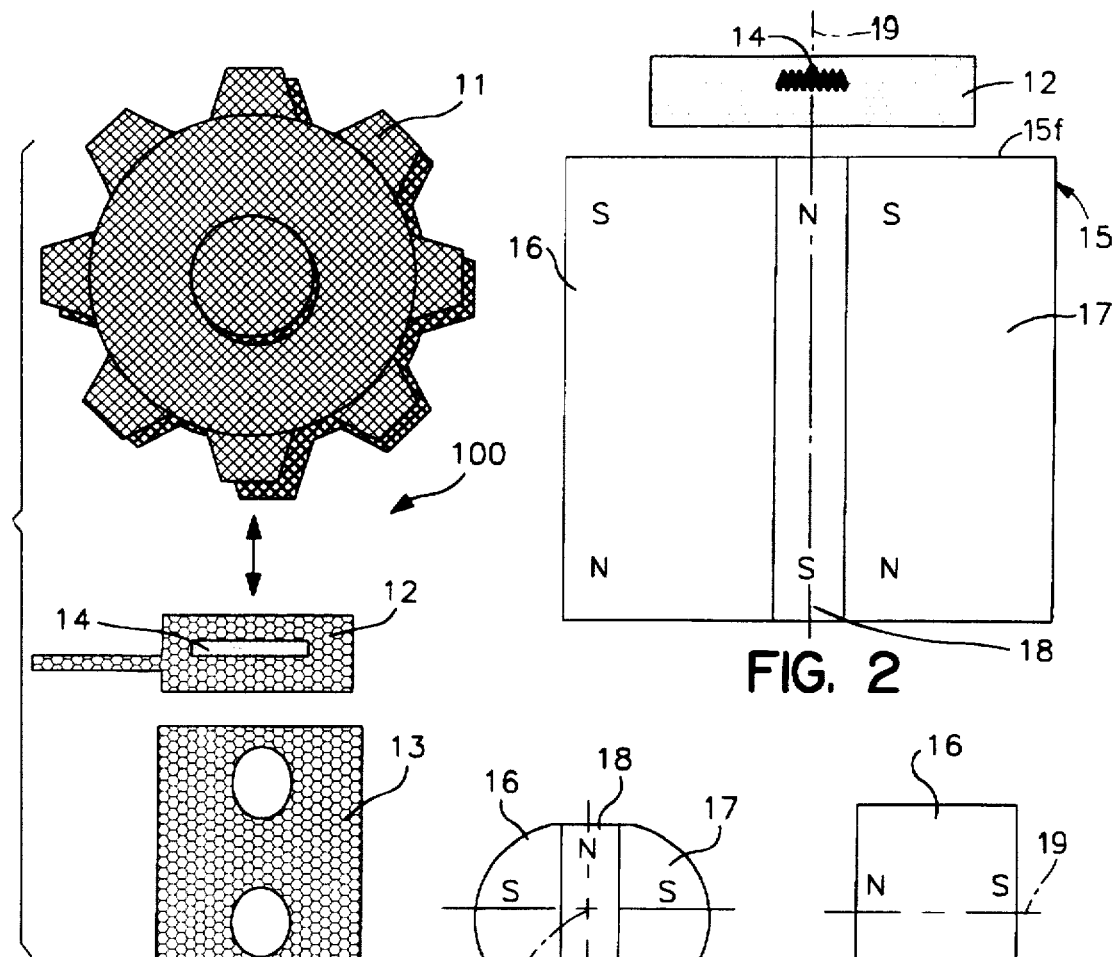
FIG. 1 (PRIOR ART)
FIG. 2
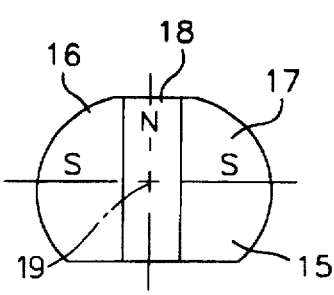
FIG. 4
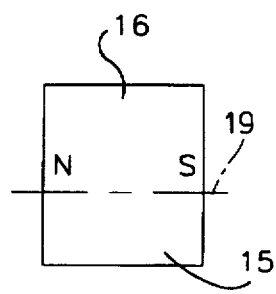
FIG. 5
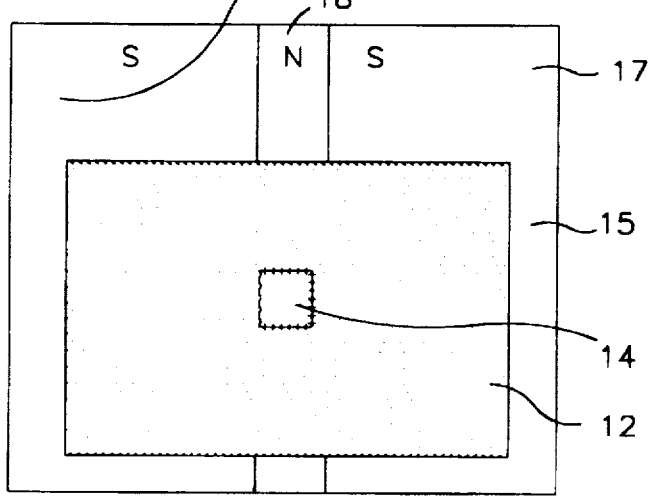
FIG. 3
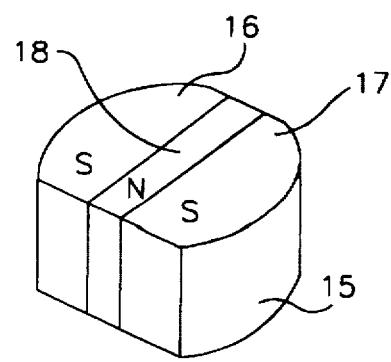
FIG. 6

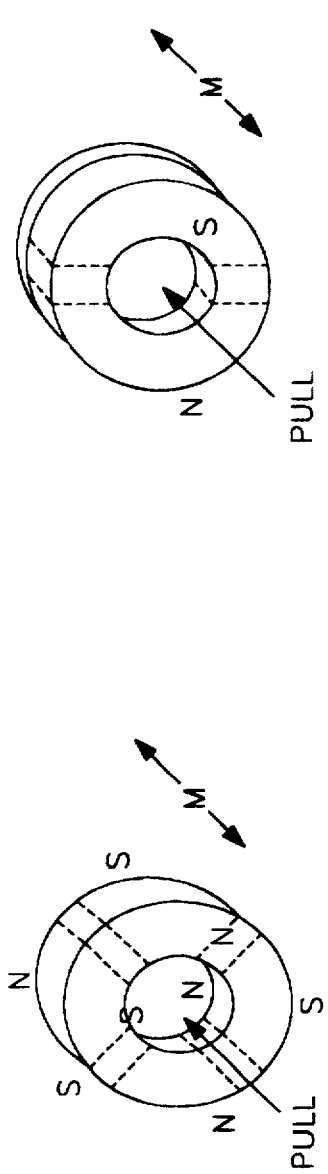
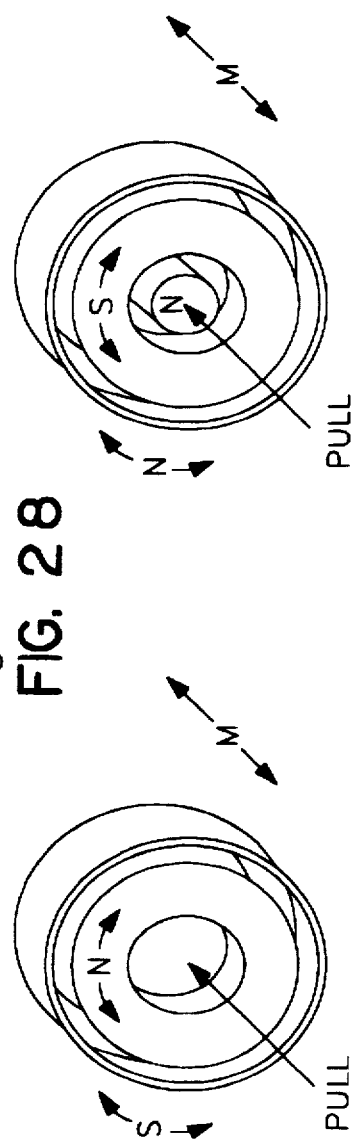
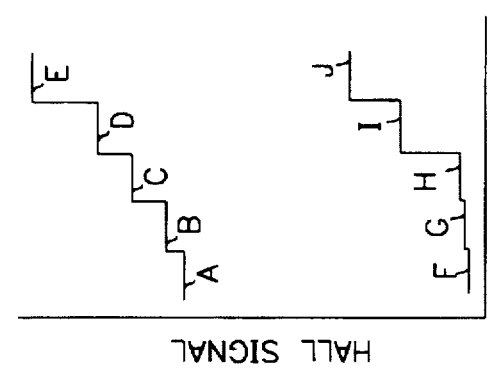
FIG. 25
FIG. 26
FIG. 27
FIG. 28
FIG. 29
FIG. 30
FIG. 31

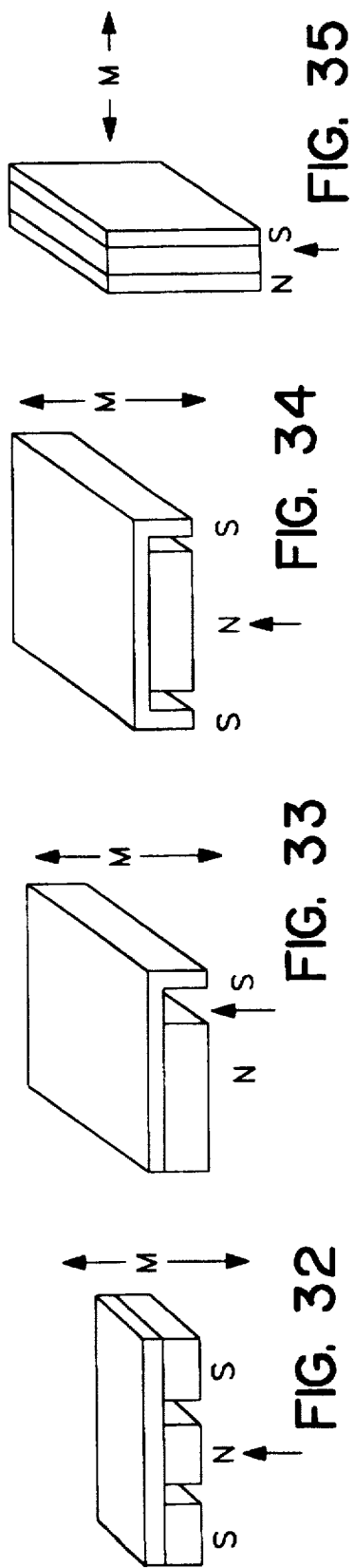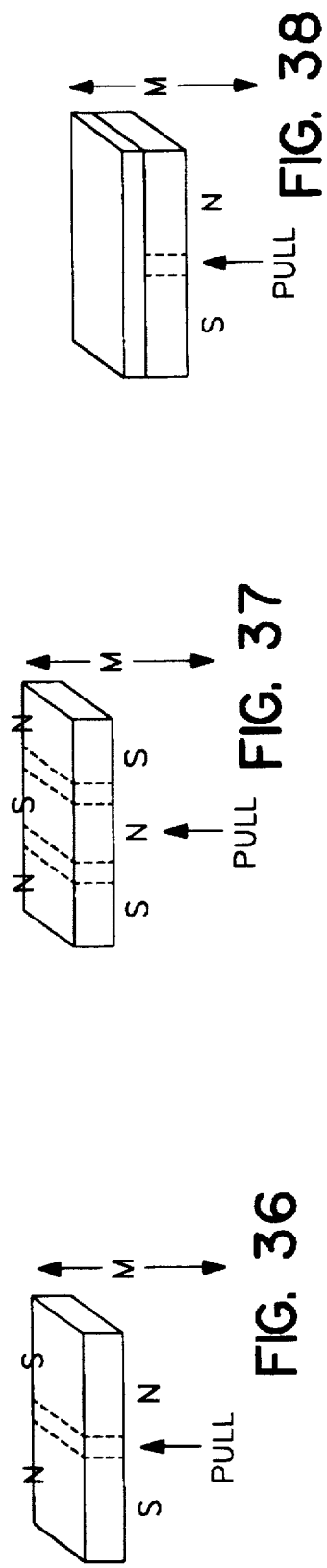

| | HALL EFFECT | MAGNETO-RESISTIVE (MR) EFFECT |
|---|---|---|
| PRINCIPLE | VOLTAGE GENERATION PERPENDICULAR TO CURRENT AND FLUX DENSITY | RESISTANCE CHANGE DEPENDING ON ANGLE BETWEEN MAGNETISATION AND CURRENT IN THE MAGNETIC MATERIAL (WHEATSTONE BRIDGE CONFIGURATION) |
| SENSITIVE MATERIAL | SEMICONDUCTOR (Si, GaAs, InSb) | METALLIC THIN FILM RESISTORS (PERMALLOY) |
| SENSITIVE TO | DETECTION OF FLUX DENSITY PERPENDICULAR TO THE DEVICE | DETECTION OF MAGNETIC FIELDS IN THE PLANE OF THE RESISTOR (PERPENDICULAR TO THE CURRENT DIRECTION) |
| SENSITIVITY FOR DETECTION OF MAGNETIC FIELDS | | $S_{HALL} \approx 0.1\ S_{MR}$ |
| SENSITIVITY TO FERROMAGNETIC MARKS OR TEETH WHEELS | DEPENDING ON MAGNETS, HYSTERESIS, MODULE OF GEAR WHEELS | |
| MAGNETS NECESSARY TO HAVE COMPARABLE MEASURING DISTANCE | RARE EARTH (SmCo) | FERRITE |
| TEMPERATURE LIMITS | INTRINSIC CONDUCTIVITY (SEMICONDUCTIVE SENSOR) | PACKAGING (METAL FILM SENSOR) |

PHILIPS SEMICONDUCTORS
SENSOR DEVICES
V. GRAEGER
26 FEBRUAR 1992

FIG. 47

HALL-EFFECT FERROMAGNETIC-ARTICLE-PROXIMITY SENSOR

FIELD OF THE INVENTION

This invention relates to a proximity sensor for detecting the presence and/or passing of a ferromagnetic article such as a gear tooth.

BACKGROUND OF THE INVENTION

This invention relates to a proximity sensor for detecting the presence and/or passing of a ferromagnetic article such as a gear tooth, and more particularly to such a "back biased" sensor comprising an assembly of a magnet structure and an integrated circuit chip having a Hall element, the chip being mounted at one end of the magnet structure and in the magnetic field created by the magnet structure. The Hall element generates an electrical signal related to the strength of the magnetic field normal to the plane of the Hall element. As a ferromagnetic article approaches the Hall element, the strength of the magnetic field normal to the Hall element is changed. Thus the distance and physical orientation between the article and the Hall element is reflected in the electrical signal generated by the Hall element. This allows the Hall-effect sensor to sense the distance between the sensor and ferromagnetic object.

A very appropriate application for a sensor of this type is in the measurement of rotational speed or rotational position of a gear or gear-shaped disk. By placing this type of sensor adjacent the periphery of the gear, the presence, proximity, passing and rate-of-passing of the gear teeth by the sensor is reflected in the electrical signal. Thus, the sensor can be used as a speedometer, tachometer, or for monitoring rotary or linear motion or position.

The prior art Hall-effect sensor employs a magnet structure consisting of a cylindrical permanent magnet with one pole (N or S) at each flat end. The Hall chip is positioned adjacent one end (and one pole) and with the plan of the Hall element parallel to the plan of the magnet end.

The integrated circuit chips of such prior art proximity sensors almost always include an essentially linear Hall-voltage amplifier for amplifying the Hall output voltage. Also included in many such Hall integrated circuits is a Schmitt trigger circuit for producing a binary output signal that changes from one level (a standby level) to the other binary level (an action level) when a ferrous article approaches to within a critical distance at which the magnetic field, normal to a major face of the chip, exceeds a predetermined magnitude. These circuits are normally DC connected so that the sensor is capable of sensing passing ferrous articles at zero rate (e.g. one a year) up to a high rate (e.g. 100 KHz).

This prior art sensor design was developed to sense the presence of a target, such as a gear tooth, that was magnetized, that is, was itself a permanent magnet. Although, in theory, this design could function as a sensor for ferromagnetic objects, that is, objects with high magnetic permeability, such as objects made of iron or iron alloys, the design does not work well in all applications. One reason for this deficiency, as will be discussed below, is the very high baseline or no-object-present magnetic flux and signal. The object-present signal in many application situations is not so much greater than the baseline signal, and the presence of electronic noise, can cause the prior art design to be unreliable.

A two-Hall-element design has been found to be an improvement in certain situations. By replacing the single Hall-element with two closely spaced elements, electrically connected to cancel each other out at the baseline condition, a good signal can be produced. Unfortunately, the signal is a transition from baseline as each leading and trailing tooth edge passes by the sensor. In an appropriate situation, this is a useful sensor for measuring the rate of tooth passage. However, this design does not provide a reliable indication of the presence or absence of a tooth or other object upon power up.

In many applications, the presence or absence of the tooth is used to communicate information to the sensor. For example, in an automobile engine, a toothed gear might present a tooth to a sensor when a particular cylinder is in position to be fired. Upon starting the engine ignition procedure, the sensor would withhold fuel from the cylinder until the sensor sensed the tooth. In that way, unburned fuel would not be exhausted into the atmosphere during start-up and start-up pollution would be reduced. Such a system could not employ an unreliable signal nor a signal that only sensed edge-passing.

These and other difficulties experienced with the prior art devices have been obviated in a novel manner by the present invention.

It is an object of the present invention to provide a method for making a Hall ferromagnetic-article proximity sensor wherein the sensor is highly sensitive to the presence or absence of ferromagnetic articles in the region of the sensor.

It is another object of the present invention to provide a Hall ferromagnetic-article proximity detector that is relatively insensitive over a range of closeness and over a range of remoteness of the ferromagnetic article from the sensor.

It is another object of the present invention to provide a gear-tooth sensor which generates an electrical signal which very clearly distinguishes between the tooth-present situation and the tooth-absent situation, upon power-up, even for relatively remote gears.

It is another object of the present invention to provide a gear-tooth sensor which is designed so that the magnetic flux measured by a Hall element (that is, flux density normal to the plane of the Hall element) is low in absolute value or zero in the absense of or remoteness of the ferromagnetic object.

With these and other objects in view, as will be apparent to those skilled in the art, the invention resides in the combination of parts set forth in the specification and covered by the claims appended hereto.

SUMMARY OF THE INVENTION

A proximity sensor for ferromagnetic articles is comprised of a magnet structure, an integrated circuit chip of the kind including a Hall element and a circuit means for generating a signal that is a function of the output of the Hall element. The chip is mounted with respect to the magnet structure, so that the chip is adjacent at least two poles of the magnet structure, and so that substantially all of the baseline magnetic flux passing through the Hall element is parallel to the plane of the Hall element.

This invention is a Hall-effect sensor, adapted to sense a ferromagnetic object, comprising an integrated circuit chip including a planar Hall element which is positioned in, parallel to, and defines a sensor plane having a front side and a back side, and which element is normal to and centered on a sensor axis, and a magnet structure having an N pole and an S pole, the magnet structure being positioned behind the sensor plane and positioned so that an S pole and an N pole are adjacent each other and both are adjacent the element.

For the purpose of this description, a magnet structure that presents at least one N pole (or pole piece equivalent) and at least one S pole (or pole piece equivalent) to a single magnet face shall be called a compound magnet. If the compound magnet is formed of a laminate of separate magnetized pieces, then it is called a sandwich magnet. If it is formed of separately magnetized zones of a single piece of magnetizable material, then it is called a multi-pole magnet. If the magnet structure provides one magnetic pole at the axis on the magnet face and the other magnetic pole on at least both sides of the axis (N-S-N or S-N-S) then it is called a symetric compound magnet.

The Hall-effect sensor is adapted to sense the presence of a ferromagnetic object in the vicinity of the sensor, to sense the distance between the sensor and a ferromagnetic object, to sense the position of a ferromagnetic object with respect to the sensor, and/or to sense the speed at which a ferromagnetic object passes by the sensor.

The Hall-effect sensor is provided wherein the magnet structure forms a magnetic sensor field in front of the magnet and extending forward of the sensor plane, said field imposing a magnetic flux density component in and normal to the Hall element, the value of the component being related to the position of the ferromagnetic object in the field.

The Hall-effect sensor is provided wherein the magnet structure forms a magnetic sensor field in front of the magnet and extending forward of the sensor plane, said field imposing a magnetic flux density component in and normal to the Hall element, the value of the component being related to the position of the ferromagnetic object in the field, and wherein the value of the component has a baseline value which has an absolute value close-to-zero Gauss and occurs when the object is at an out-of-range distance from the sensor. The close-to-zero value has an absolute value of less than or equal to 400 Gauss. The out-of-range distance is greater than or equal to 10 mm. The Hall element is a distance of 0.5 to 2.0 mm from the magnet structure. The Hall element is a distance of 1 mm from the magnet structure.

The Hall-effect sensor is provided wherein the magnet structure has a flat front face adjacent the chip and parallel to the sensor plane, said magnet structure including at least two parts, one of which presents an N pole to front face, and the other one of which presents an S pole to front face.

The Hall-effect sensor is provided wherein the magnet structure has a flat front face adjacent the chip and parallel to the sensor plane, said magnet structure including at least two parts, one of which presents an N pole to front face, and the other one of which presents an S pole to front face, and one of which parts is set back from the face to adjust the baseline magnetic field created by the magnet structure.

The Hall-effect sensor is provided wherein the magnet structure has a flat front face adjacent the chip and parallel to the sensor plane, said magnet structure including at least two permanent magnets, one of which presents an N pole to front face, and the other one of which presents an S pole to front face.

The Hall-effect sensor is provided wherein the magnet structure has a flat front face adjacent the chip and parallel to the sensor plane, said magnet structure including at least one permanent bar magnet and at least one pole piece which is temporarily magnetized by its presence in the magnet structure, one of which presents an N pole to the front face, and the other one of which presents an S pole to the front face.

The Hall-effect sensor is provided wherein the magnet structure has a flat front face adjacent the chip and parallel to the sensor plane, said magnet structure including at least two permanent magnets and at least one pole piece which is positioned between the permanent magnets and which is temporarily magnetized by its presence in the magnet structure, the permanent magnets presenting one of the magnetic poles to the front face, and the pole piece presenting the other magnetic pole to the front face.

The Hall-effect sensor is provided wherein the magnet structure is in the shape of a cylinder with a magnet axis and a flat front face adjacent the chip and parallel to the sensor plane.

The Hall-effect sensor is provided wherein the magnet structure is in the shape of a cylinder with a magnet axis and a flat front face adjacent the chip and parallel to the sensor plane, said magnet structure including at least two permanent magnets, one of which presents an N pole to front face, and the other one of which presents an S pole to front face.

The Hall-effect sensor is provided wherein the magnet structure is in the shape of a cylinder with a magnet axis and a flat front face adjacent the chip and parallel to the sensor S plane, said magnet structure including at least one permanent bar magnet and at least one pole piece which is temporarily magnetized by its presence in the magnet structure, one of which presents an N pole to the front face, and the other one of which presents an S pole to the front face.

The Hall-effect sensor is provided wherein the magnet structure is in the shape of a cylinder with a magnet axis and a flat front face adjacent the chip and parallel to the sensor plane, said magnet structure including at least two permanent magnets and at least one pole piece which is positioned between the permanent magnets and which is temporarily magnetized by its presence in the magnet structure, one of permanent magnets presenting at least one of the magnetic poles to the front face, and the pole piece presenting the other magnetic pole to the front face.

BRIEF DESCRIPTION OF THE DRAWING

The character of the invention, however, may best be understood by reference to one of its structural forms, as illustrated by the accompanying drawings, in which:

FIG. 1 is a diagrammatic view in which are shown the general features of sensor systems to which the present invention is concerned.

FIG. 2 is a diagrammatic view in which is shown the manner in which the present invention replaces the magnet structure behind the chip in FIG. 1 with a compound magnet structure which presents both the S pole and the N pole to the back side of the chip and adjacent to one another.

FIG. 3 is a plan view looking along the axis of the magnet which is normal to the compound magnet face, to the front and back faces of the chip and to the plane of the Hall element within the chip.

FIG. 4 is a view of the preferred design of the magnet structure, looking at the primary magnet face.

FIG. 5 is a side view of the preferred design of the magnet structure.

FIG. 6 is a perspective view of the preferred design of the magnet structure, with the axis extending up and out of the paper from the primary compound face.

In FIG. 20, the magnetic face upon which the Hall sensor is mounted is shown as a compound structure.

FIG. 25 is a graphical representation of the Hall-effect flux density sensed in the various configurations shown in FIGS. 15 to 24.

FIG. 26 is a perspective view of a magnet structure which includes four magnetized poles and one face.

FIG. 27 is a perspective view of a magnet structure which includes two poles, one face, and steel back plate.

FIG. 28 is a perspective view of a magnet structure which includes four poles, one face with steel back plate.

FIG. 29 is a perspective view of a magnet structure which includes a pole parallel to thickness with steel back plate and center pole.

FIG. 30 is a perspective view of a magnet structure which includes a pole parallel to thickness with steel cup.

FIG. 31 is a perspective view of a magnet structure which includes a pole parallel to thickness with steel cup and center pole.

FIG. 32 is a perspective view of a magnet structure which includes three alternated magnets with steel back plate.

FIG. 33 is a perspective view of a magnet structure which includes a pole parallel to thickness with steel angle.

FIG. 34 is a perspective view of a magnet structure which includes a pole parallel to thickness with steel channel.

FIG. 35 is a perspective view of a magnet structure which includes poles parallel to thickness with two steel side plates.

FIG. 36 is a perspective view of a magnet structure which includes two magnetized poles and one face (through).

FIG. 37 is a perspective view of a magnet structure which includes three magnetized poles and one face (through).

FIG. 38 is a perspective view of a magnet structure which includes two magnetized poles and one face (through), with a steel back plate.

FIG. 39 is a perspective view of a magnet structure which includes two magnets with steel back plate.

FIG. 40 is a perspective view of a magnet structure which includes three magnetized poles and one face (through), with a steel back plate.

FIG. 47 is a chart comparing the features of a Hall element and a substitute sensor called a magneto-resistive element.

DESCRIPTION OF THE PREFERRED EMBODIMENT

Figure 7A:
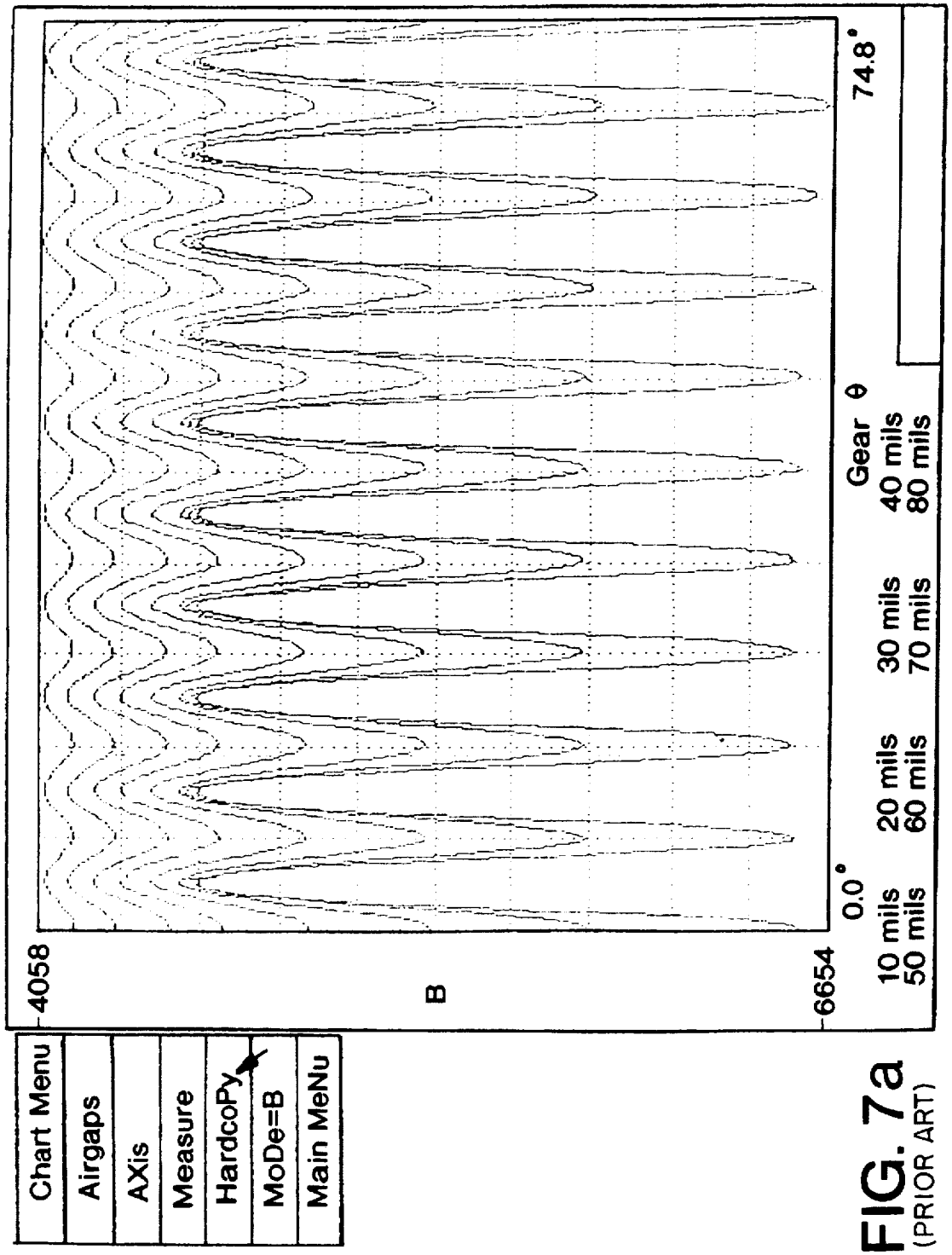
FIG. 7a is a flux map showing the variation in magnetic field as a function of air gap between the Hall element and the gear in an earlier conceived construction with a single pole of the magnet adjacent the Hall element and configured for monitoring the passage of ferromagnetic gears.

Referring first to FIG. 1, in which are shown the general features of sensor systems 100 to which the present invention is concerned, the system includes a ferromagnetic target 11, such as a steel gear, a Hall-effect sensor chip 12, and a magnet structure 13. In FIG. 1, the magnet structure is of the conventional bar magnet type with the S pole on one end adjacent the chip, and the N pole on the other end. This system may have one or two Hall elements 14 in the chip, both choices, as described above, have problems.

As shown in FIG. 2, the present invention replaces the magnet structure 13 behind the chip with a compound magnet structure 15 which presents both the S pole and the N pole to the back side of the chip and adjacent to one another. This geometry creates more a appropriate magnetic field around the planar Hall element 14. FIG. 2 shows a simple sandwich construction in which two cladding bar magnets 16 and 17 are attached to a core bar 18. The core bar 18 could be a permanent magnet oriented with poles opposite to those of the cladding magnets. Alternatively, the core bar could be a pole piece which has a high magnetic permeability (readily conducts magnetic flux), but is not itself a permanent magnet. The cladding magnets would induce temporary magnetism in the pole piece and cause it to act like an oppositely poled magnet, as long as the sandwich structure is maintained. In both cases, the magnet structure presents both the S and N poles to the back of the chip and exposes the Hall element to the magnetic field which exists in front of the multi-polar surface. Such a construction can also be achieved using a single piece of permanantly magnetizable material which has been magnetized in three separate zones to form the pole structure described above. FIG. 3 is a plan view looking along the axis of the magnet. The axis 19 is normal to the compound magnet face, to the front and back faces of the chip and to the plane of the Hall element within the chip.

FIG. 4, 5, and 6 represent the preferred design of the magnet structure. FIG. 6 is a perspective view of the preferred design of the magnet structure, with the axis extending up and out of the paper from the primary compound face. A longitudinal flat is shown and allows electronic leads from a chip mounted on the primary face to pass along the length of the magnet without extending outside of the circular design profile of the cross section of the magnet parallel to the primary magnet face. FIG. 4 is a view of the preferred design, looking at the primary magnet face. FIG. 5 is a side view of the preferred design.

The magnet structure can take a great many forms as will be described below. The critical feature is that the magnetic structure must form a magnetic field around the Hall element which field has the effects produced when the element is adjacent two different poles that are adjacent to one another. Typically the two poles will be presented to the back face of the Hall IC. Set backs of one or more of the poles can optimize the field.

This invention is a Hall-effect sensor, adapted to sense a ferromagnetic object, comprising an integrated circuit chip including a planar Hall element which is positioned in, parallel to, and defines a sensor plane having a front side and a back side, and which element is normal to and centered on a sensor axis, and a magnet structure having an N pole and an S pole, the magnet structure being positioned behind the sensor plane and positioned so that an S pole and an N pole are adjacent each other and both are adjacent the element.

The Hall-effect sensor is adapted to sense the presence of a ferromagnetic object in the vicinity of the sensor, to sense the distance between the sensor and a ferromagnetic object, to sense the position of a ferromagnetic object with respect to the sensor, and/or to sense the speed at which a ferromagnetic object passes by the sensor.

The Hall-effect sensor is provided wherein the magnet structure forms a magnetic sensor field in front of the magnet and extending forward of the sensor plane, said field imposing a magnetic flux density component in and normal to the Hall element, the value of the component being related to the position of the ferromagnetic object in the field.

The Hall-effect sensor is provided wherein the magnet structure forms a magnetic sensor field in front of the magnet and extending forward of the sensor plane, said field imposing a magnetic flux density component in and normal to the Hall element, the value of the component being related to the position of the ferromagnetic object in the field, and wherein the value of the component has a baseline value which has an absolute value close-to-zero Gauss and occurs when the object is at an out-of-range distance from the sensor. The close-to-zero value has an absolute value of less than or equal to 400 Gauss. The out-of-range distance is greater than or equal to 10 mm. The Hall element is a distance of 0.5 to 2.0 mm from the magnet structure. The Hall element is a distance of 1 mm from the magnet structure.

The Hall-effect sensor is provided wherein the magnet structure has a flat front face adjacent the chip and parallel to the sensor plane, said magnet structure including at least two parts, one of which presents an N pole to front face, and the other one of which presents an S pole to front face.

The Hall-effect sensor is provided wherein the magnet structure has a flat front face adjacent the chip and parallel to the sensor plane, said magnet structure including at least two parts, one of which presents an N pole to front face, and the other one of which presents an S pole to front face, and one of which parts is set back from the face to adjust the magnetic field created by the magnet structure.

The Hall-effect sensor is provided wherein the magnet structure has a flat front face adjacent the chip and parallel to the sensor plane, said magnet structure including at least two permanent magnets, one of which presents an N pole to front face, and the other one of which presents an S pole to front face.

The Hall-effect sensor is provided wherein the magnet structure has a flat front face adjacent the chip and parallel to the sensor plane, said magnet structure including at least one permanent bar magnet and at least one pole piece which is temporarily magnetized by its presence in the magnet structure, one of which presents an N pole to the front face, and the other one of which presents an S pole to the front face.

The Hall-effect sensor is provided wherein the magnet structure has a flat front face adjacent the chip and parallel to the sensor plane, said magnet structure including at least two permanent magnets and at least one pole piece which is positioned between the permanent magnets and which is temporarily magnetized by its presence in the magnet structure, one of permanent magnets presenting at least one of the magnetic poles to the front face, and the pole piece presenting the other magnetic pole to the front face.

The Hall-effect sensor is provided wherein the magnet structure is in the shape of a cylinder with a magnet axis and a flat front face adjacent the chip and parallel to the sensor plane.

The Hall-effect sensor is provided wherein the magnet structure is in the shape of a cylinder with a magnet axis and a flat front face adjacent the chip and parallel to the sensor plane, said magnet structure including at least two permanent magnets, one of which presents an N pole to front face, and the other one of which presents an S pole to front face.

The Hall-effect sensor is provided wherein the magnet structure is in the shape of a cylinder with a magnet axis and a flat front face adjacent the chip and parallel to the sensor plane, said magnet structure including at least one permanent bar magnet and at least one pole piece which is temporarily magnetized by its presence in the magnet structure, one of which presents an N pole to the front face, and the other one of which presents an S pole to the front face.

The Hall-effect sensor is provided wherein the magnet structure is in the shape of a cylinder with a magnet axis and a flat front face adjacent the chip and parallel to the sensor plane, said magnet structure including at least two permanent magnets and at least one pole piece which is positioned between the permanent magnets and which is temporarily S magnetized by its presence in the magnet structure, the permanent magnets presenting one of the magnetic poles to the front face, and the pole piece presenting the other magnetic pole to the front face.

FIG. 7a concerns an earlier conceived construction with a single pole of the magnet adjacent the Hall element and configured for monitoring the passage of ferromagnetic gears. FIG. 7 is a flux map showing the variation in magnetic field as a function of air gap between the Hall element and the gear. The graph is in negative Gauss, so the baseline (between teeth) is the upper curve of each data line. The amplitude of the data lines increases with decreased air gap (tooth to sensor distance). The baseline field is extremely high, that is, the magnetic force field is 3000 G (actually −3000 G since the pole adjacent the Hall chip is S so the flux is negative) for the SmCo magnet used in this case. To work over large air gaps, an extremely small magnetic field variation must be measured on a large base field. For example, the 80 mil gap creates a 100 G signal on a 3000 G base field. This is an extremely difficult task. In addition, in some cases, the base field moves, with air gap, due to cross talk between neighboring teeth. When background signal noise which is always present in real situations is considered, the problem becomes even more severe.

Figure 7B:
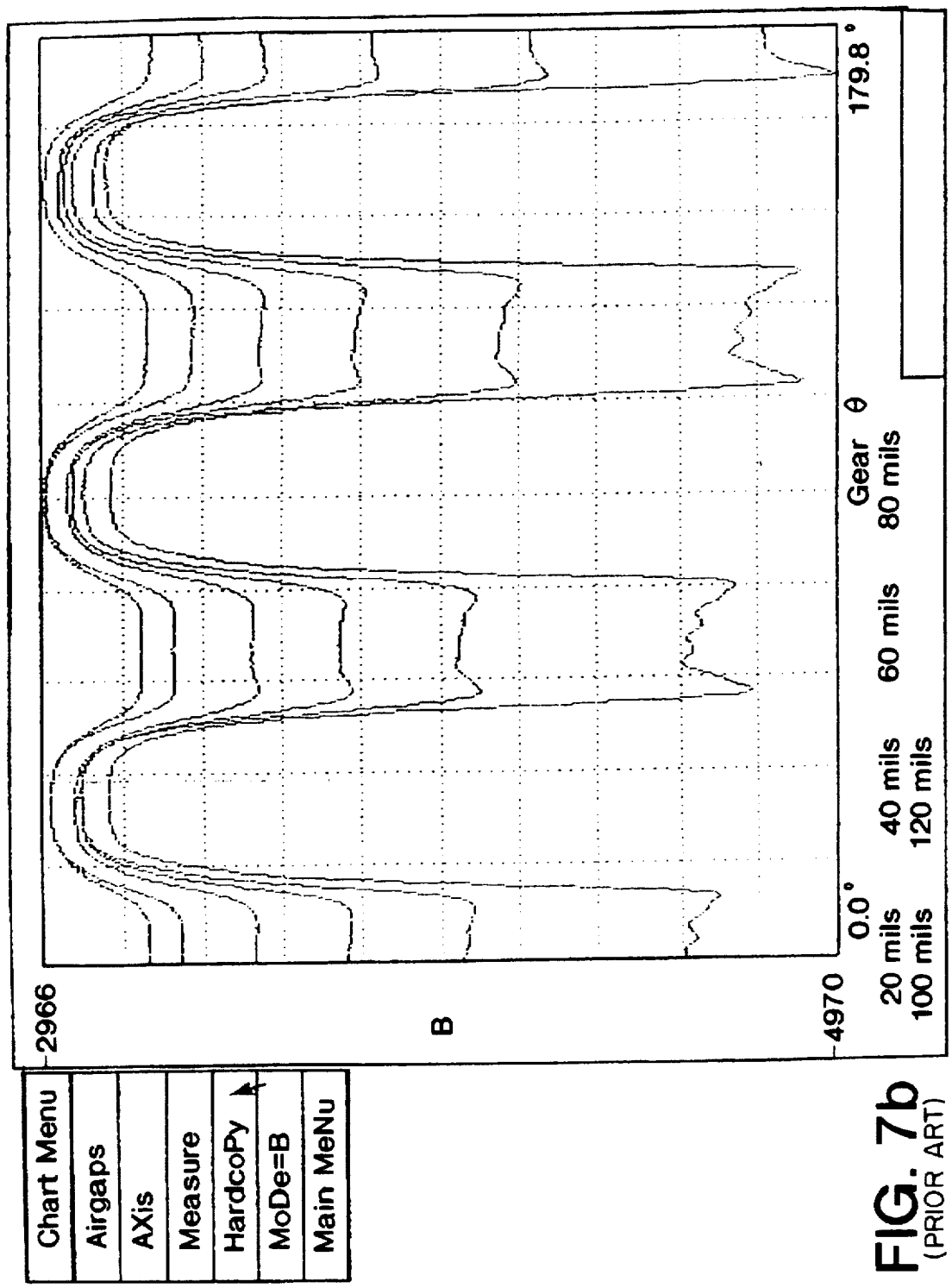
FIG. 7b is similar to FIG. 7a except that FIG. 7b used a target with wider teeth and a wider gap between the teeth.

FIG. 7b is similar to FIG. 7a except that FIG. 7b used a target with wider teeth and a wider gap between the teeth.

Figure 8:
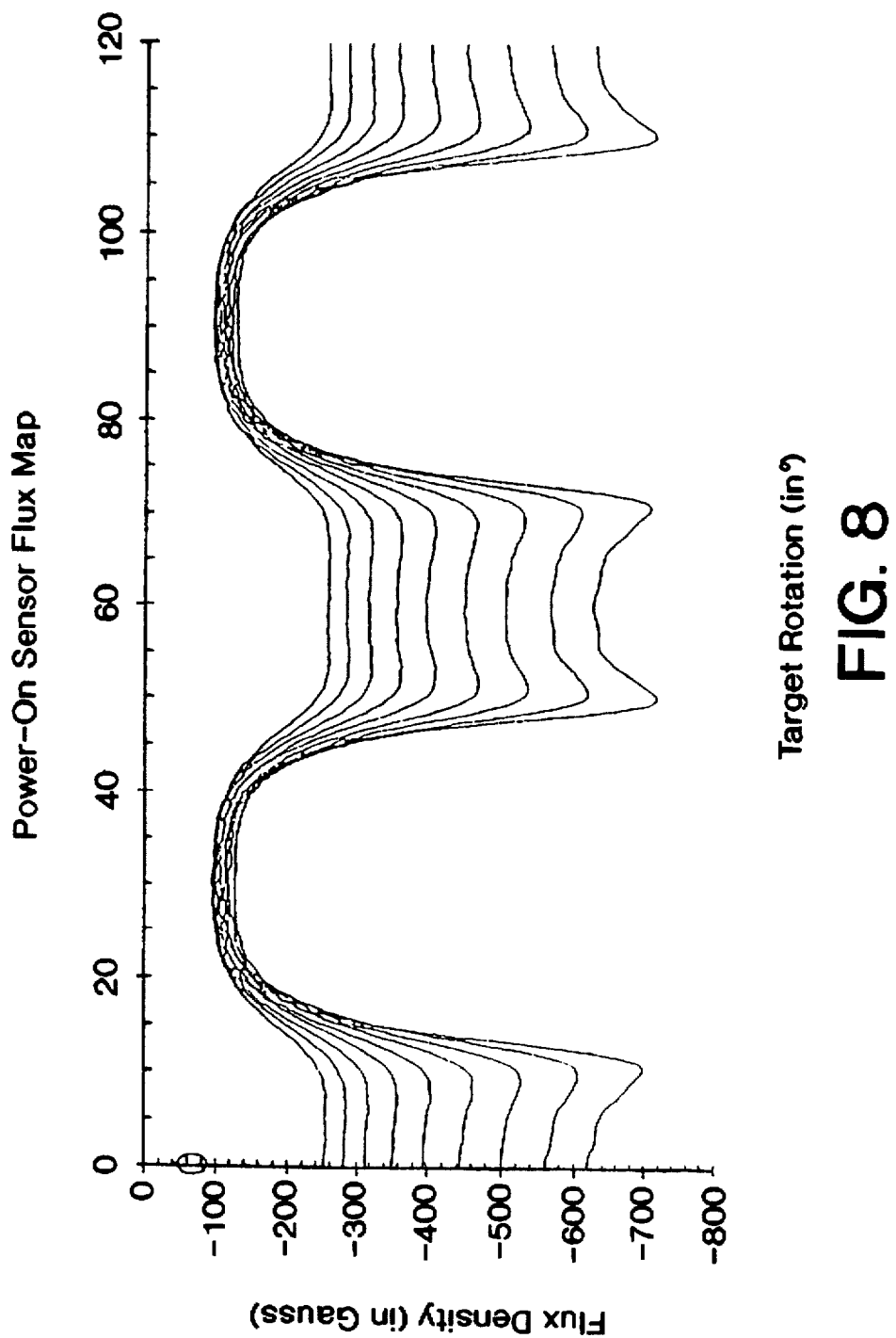
FIG. 8 concerns the compound configuration of the present invention and is a power-on flux map of flux density in Gauss, for various air gaps (tooth to sensor distances) over the target (gear) rotation.

FIG. 8 concerns the compound ( in this case, S-N-S) configuration of the present invention and is a power-on flux map of flux density in Gauss, for various air gaps (tooth to sensor distances) over the target (gear) rotation. The target is substantially the same as that used in FIG. 7b. Zero degrees is the center of the tooth. The compound configuration lowers the base field (to approximately −100 G) on the face of the Hall element by bringing both of the poles of the magnetic field to the immediate rear of the Hall element. The near presence of the opposite poles serves to short out the lines of flux in the open circuit (when the valley and not the tooth is present). This creates a low baseline field because the lines of magnetic flux are parallel to and below the Hall element in the chip. Proper design can allow the baseline field to approach zero Gauss as measured by the Hall element. When the tooth is present, the magnetic circuit is changed and the flux lines are drawn to the tooth and through and perpendicular to the Hall element. Then, the Hall element measures a high value. Thus, the tooth causes diversion or concentration of the flux lines and may also effect or minimize the shorting (or fringing field) in the system. The result of this shorting when the tooth is absent, and diversion or concentration when the tooth is present is illustrated in the FIG. 8 flux map which was created by rotating a large pitch gear past the sensor at various air gaps between the tooth periphery and sensor. As shown, the baseline indicating the valley remains constant and of low value (close to zero) as the air gap varies. On the other hand, the flux density, indicating the presence of the tooth, drops (negative density becomes greater) with decreasing air gap. The flux densities are negative because, at the Hall element, the magnetic force lines are entering the S poles, as in the earlier configuration, and are being concentrated by the target.

Because there is a very significant and easily recognized difference between the tooth-present signal and the tooth-absent signal, on power up, that is, when the system is first energized, the sensor of the present invention provides a very reliable indication of this very critical condition, for example, in the distributor of an internal combustion engine to minimize start-up air pollution.

The sign convention used in Hall sensors is that flux from an N pole in front of the sensor to an S pole behind the sensor is negative.

Figure 9:
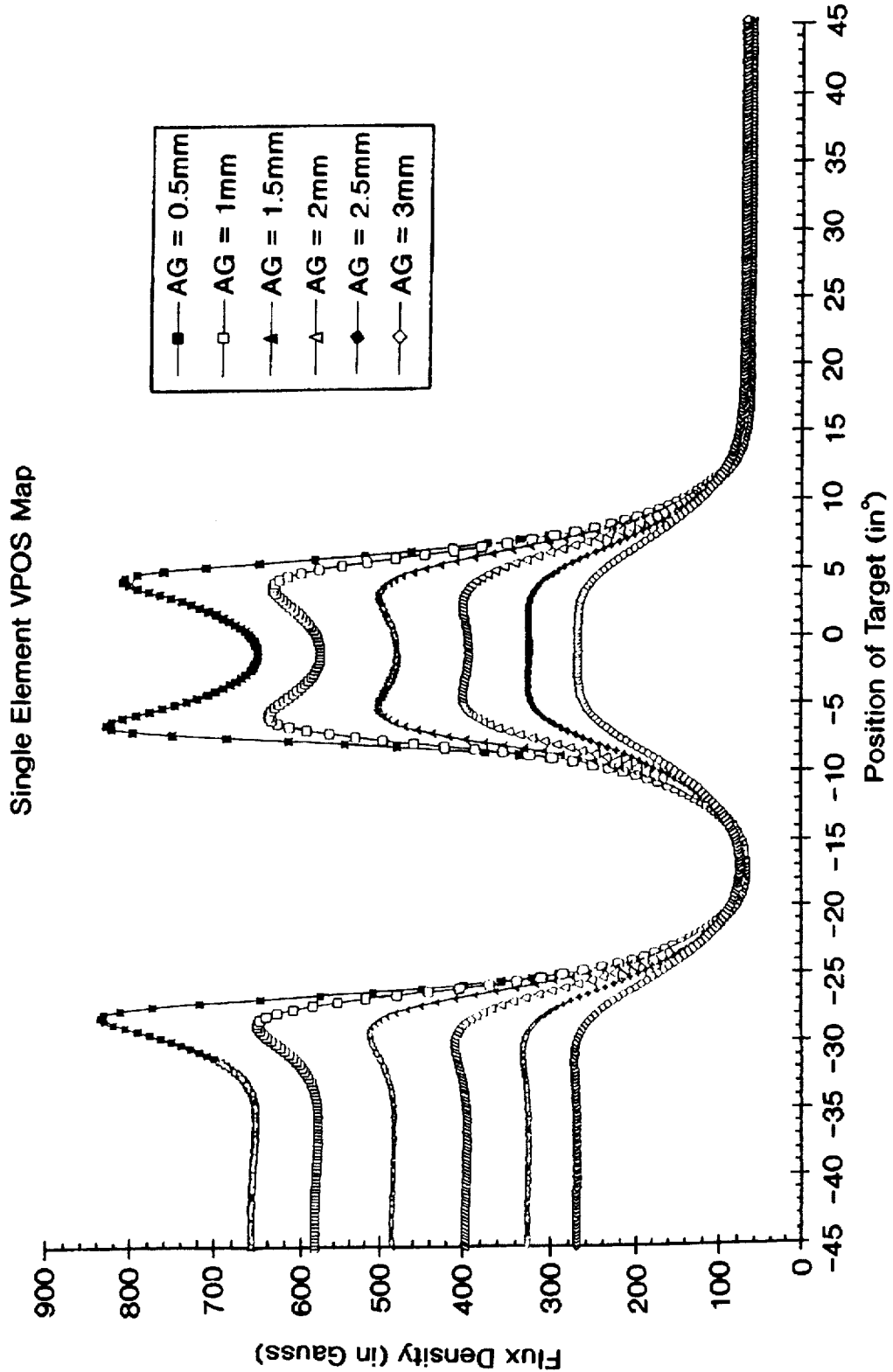
FIG. 9 is similar to FIG. 8 in that both concern the compound configuration of the present invention.

FIG. 9 is similar to FIG. 8 in that both concern the compound configuration of the present invention. FIG. 9 is a power-on flux map of flux density in Gauss, for various air gaps (tooth to sensor distances) over the target (gear) rotation. Zero degrees is the center of the tooth. The compound configuration lowers the base field (to approximately 75 G) on the face of the Hall element by bringing both of the poles of the magnetic field to the rear of the Hall element. The near presence of the opposite poles serves to short out the lines of flux in the open circuit (when the valley and not the tooth is present). This creates a low baseline field because the lines of magnetic flux are parallel to and below the Hall element in the chip. Proper design can allow the baseline field to approach zero Gauss as measured by the Hall element. When the tooth is present, the magnetic circuit is changed and the flux lines are drawn to the tooth and through and perpendicular to the Hall element. Then, the Hall element measures a high value. Thus, the tooth causes diversion of the flux lines so as to minimize the shorting (or fringing field) in the system. The result of this shorting when the tooth is absent, and diversion when the tooth is present is illustrated in the FIG. 9 flux map which was created by rotating a large pitch gear past the sensor at various air gaps between the tooth periphery and sensor. As shown, the baseline indicating the valley remains constant and of low value (close to zero) as the air gap varies. On the other hand, the flux density caused by the presence of the tooth increases with decreasing air gap. The sign of the flux is positive, because this configuration (N-S-N) has the flux lines at the Hall element exiting the N poles and being concentrated by the target.

Figure 10:
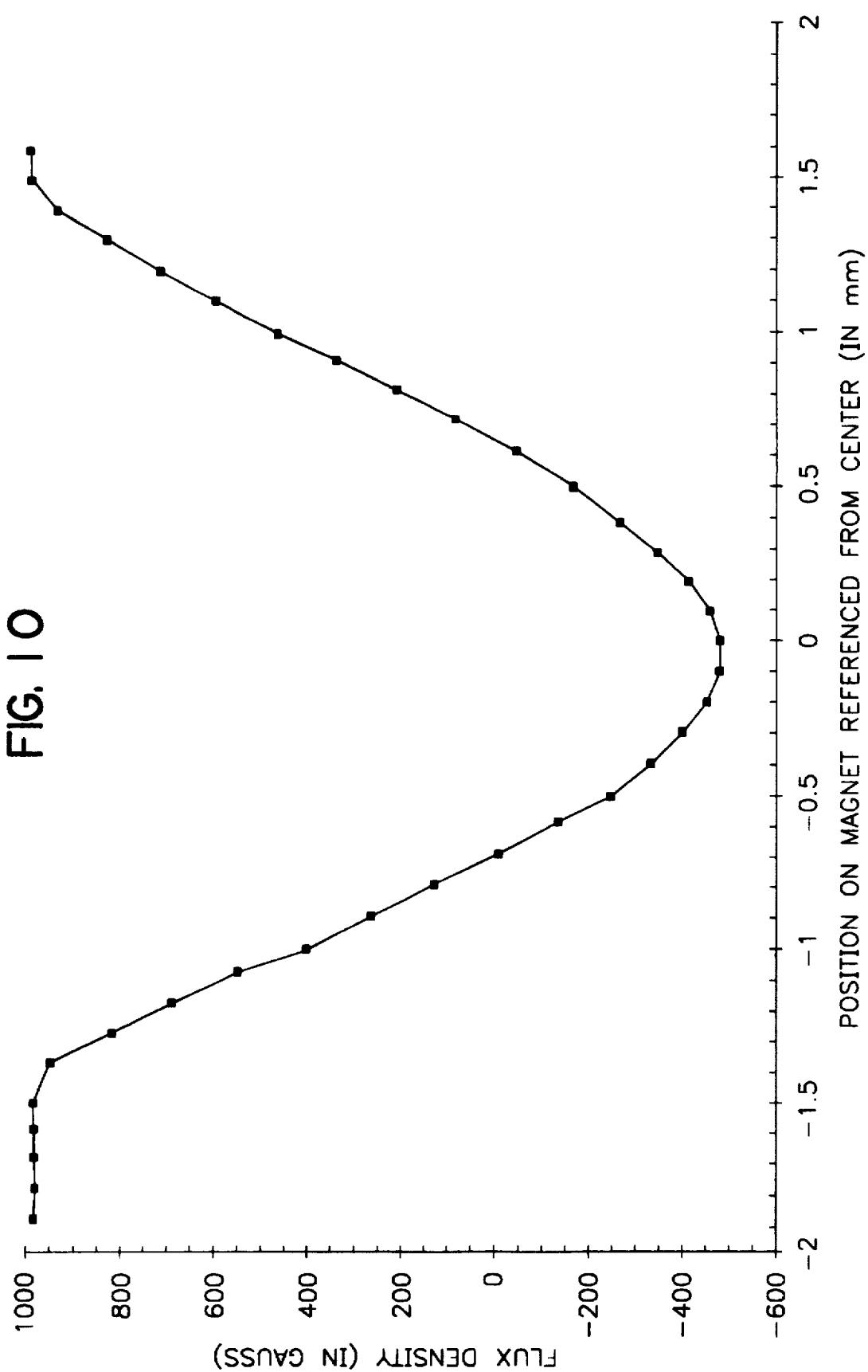
FIG. 10 presents a flux density map across the face of a sandwich magnet (N-S-N) in which two magnets with N poles at the face are separated by a pole piece which is flush with the face and presents an S pole to the face.

FIG. 10 presents a flux density map across the face of a sandwich magnet (N-S-N) in which two magnets with N poles at the face are separated by a pole piece which is flush with the face and presents an S pole to the face. The sandwich magnet is 8 mm wide across the face with the pole piece being 1 mm wide and the side magnets being 3.5 mm wide each. At the center of the face and the pole piece the flux is −500 G. The value is negative because the point is adjacent a S pole. As the measuring point moves sideways across the face, the flux moves toward zero and reaches zero at slightly outside of the pole-piece-magnet boundary. Then, as the measuring point moves further sideways, the flux increases positively as it moves across the N pole, to a maximum value of 1000 G at 1 mm away from the pole-piece-magnet boundary. The measuring tool saturates at or does not record a value above 1000 G. It should be understood that this map presents only the flux component normal to the magnet face.

Figure 11:
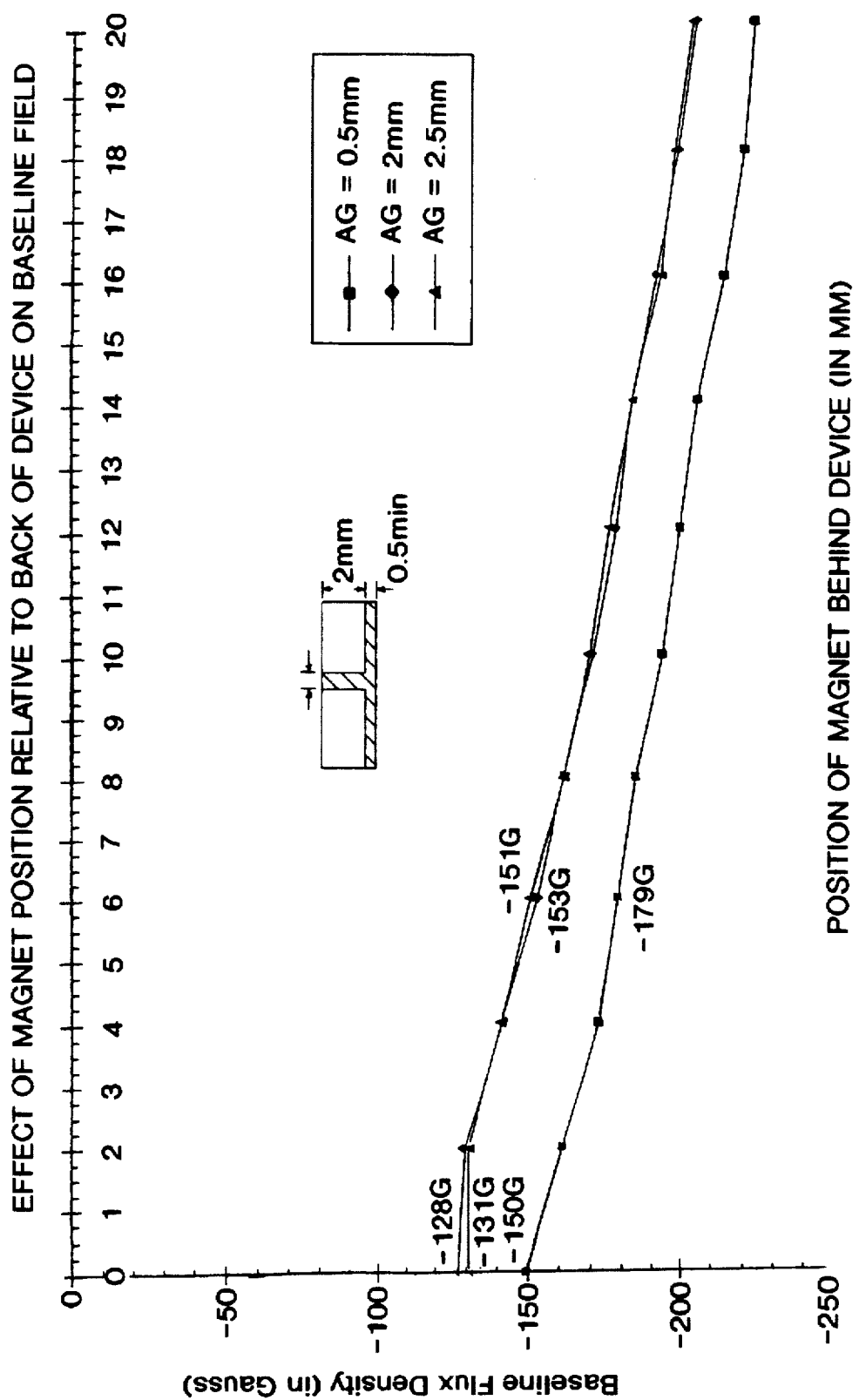
FIG. 11 shows the effect of magnet position relative to the back of the Hall element on baseline field strength, for a sandwich magnet with flush, tee-shaped pole piece.

FIG. 11 shows the effect of magnet position relative to the back of the Hall element on baseline field strength, for a sandwich magnet with flush, tee-shaped pole piece. The graph shows flux density versus position of the magnet behind the Hall device for various air gaps.

Figure 12:
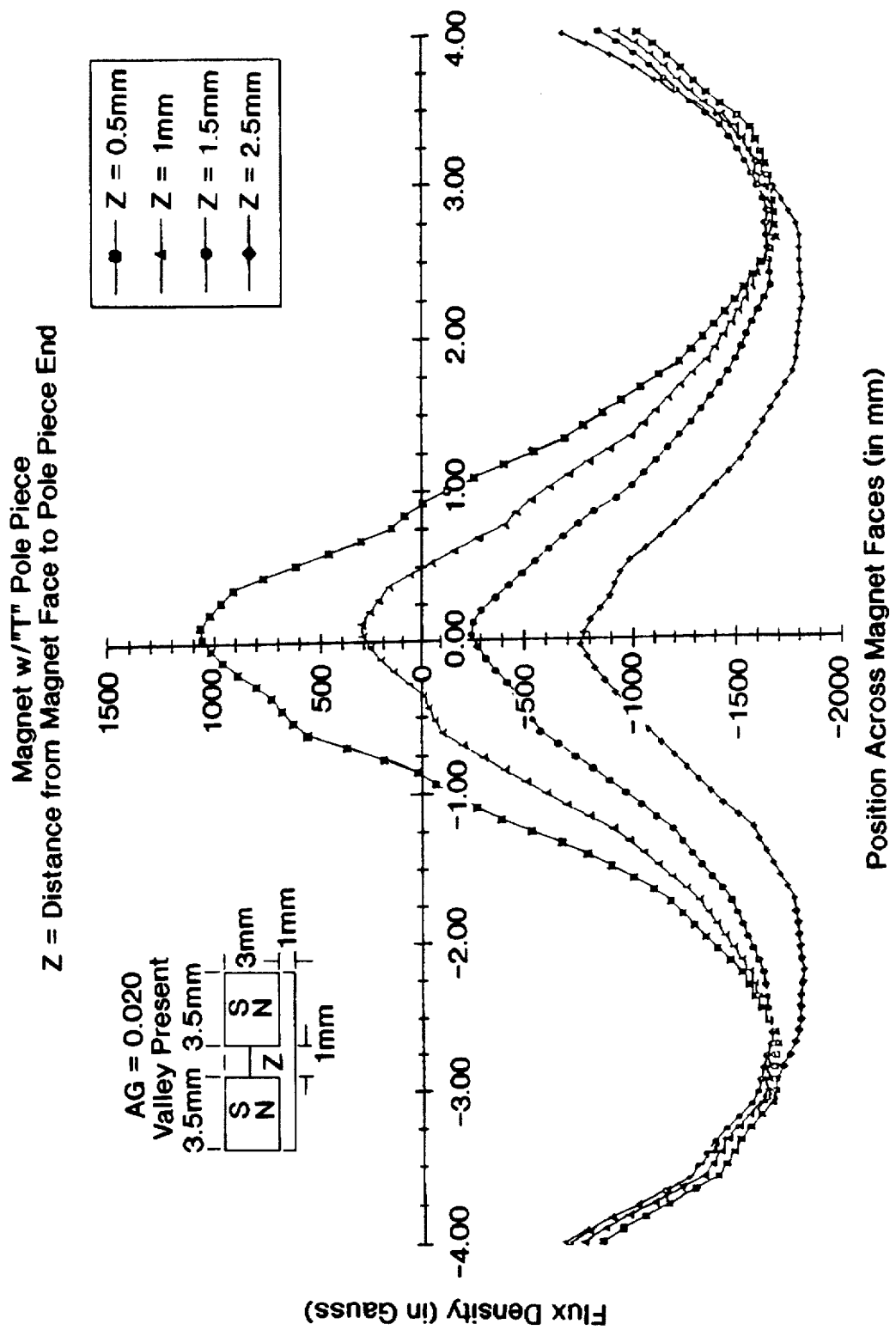
FIG. 12 shows the effect of setting back the pole piece from the magnet face by Z mm on the baseline (valley present) flux density across the face of a tee-pole-piece sandwich magnet.

FIG. 12 shows the effect of setting back the pole piece from the magnet face by Z mm on the baseline (valley present) flux density across the face of a tee-pole-piece sandwich magnet. It can be seen that a Z of 1.25 makes the center baseline flux approximately zero.

Figure 13:
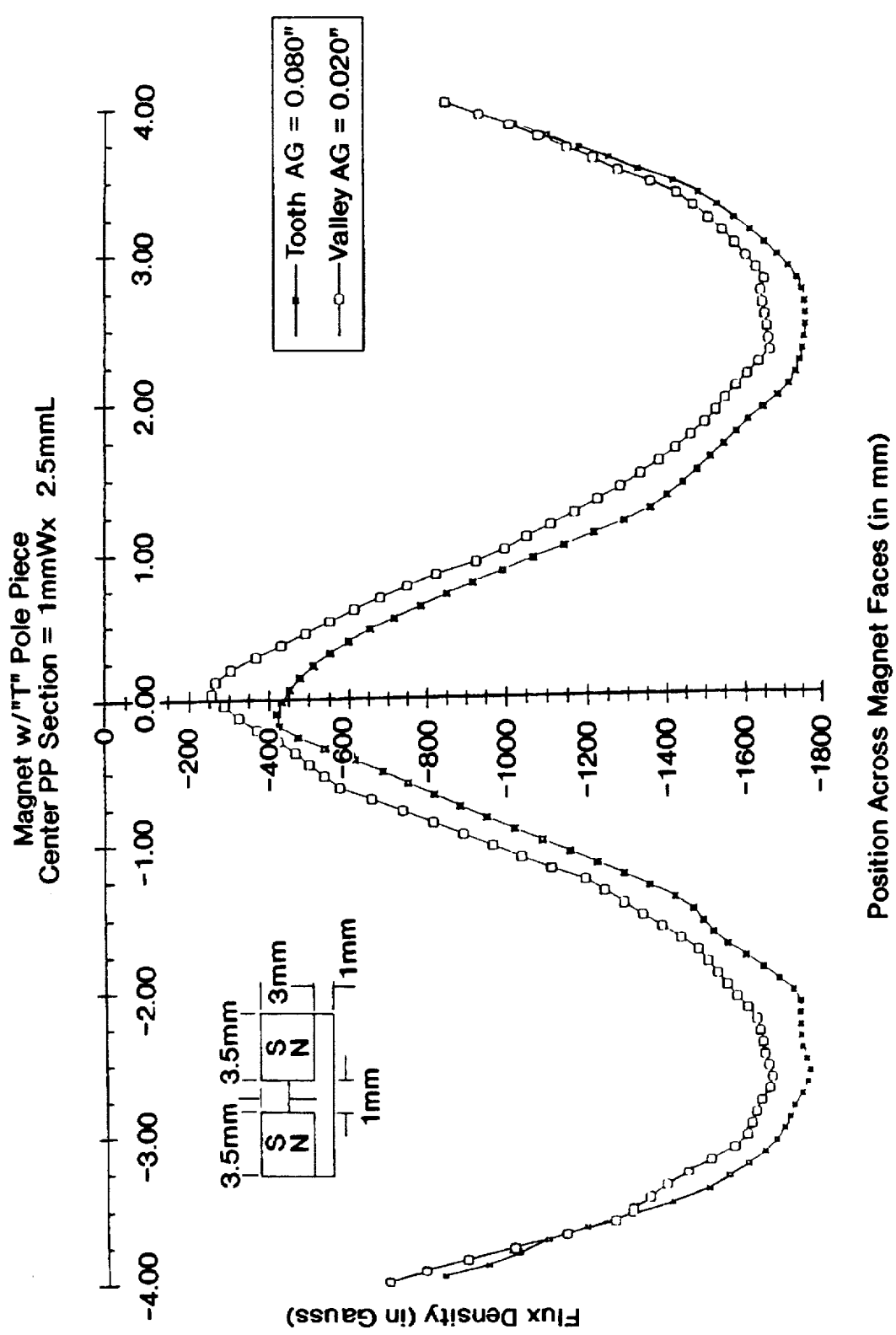
FIG. 13 shows a flux map across the face of a tee-pole-piece sandwich magnet with a pole piece set-back of 1.5 mm.

FIG. 13 shows a flux map across the face of a tee-pole-piece sandwich magnet with a pole piece set-back of 1.5 mm.

Figure 14:
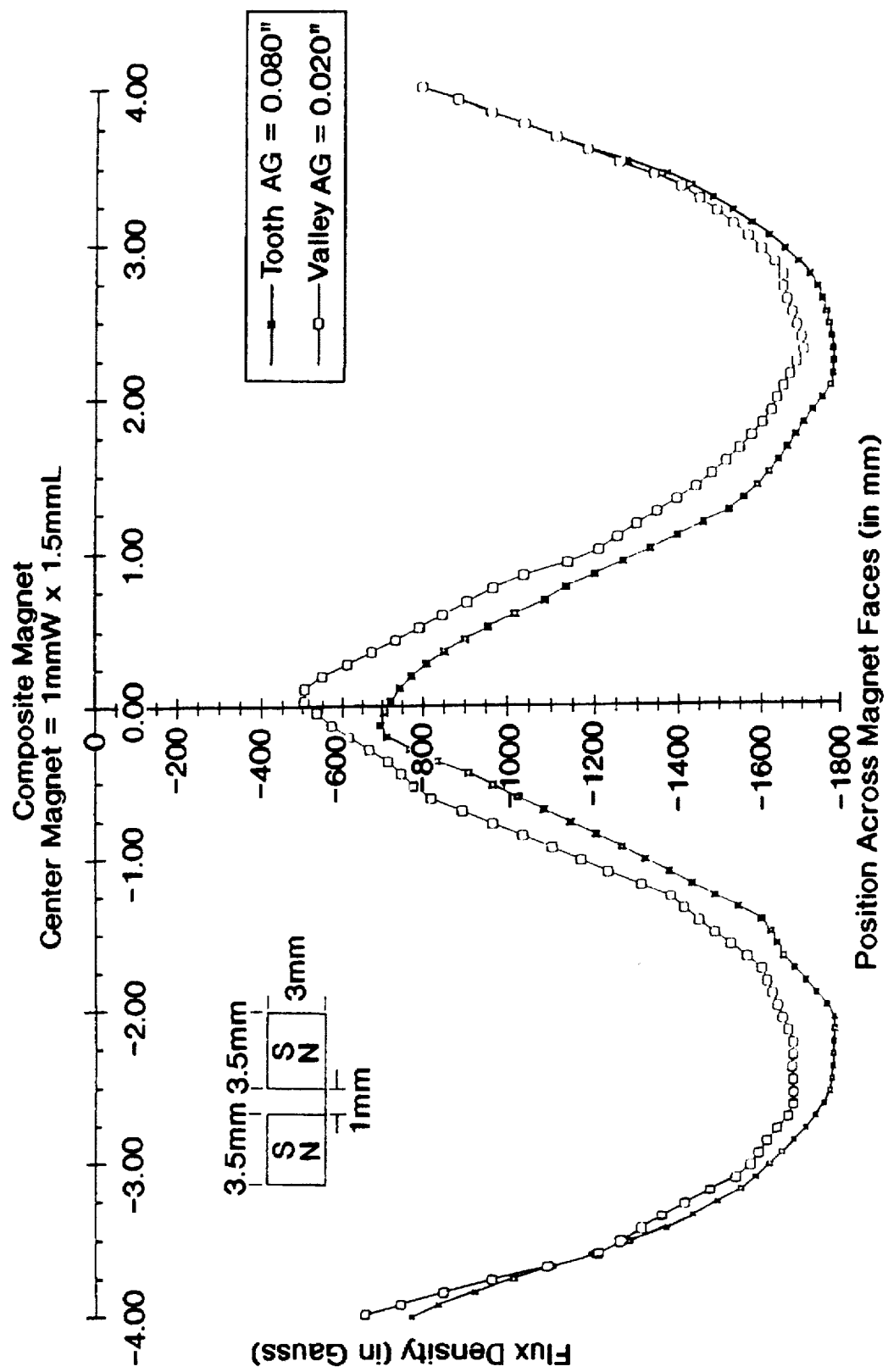
FIG. 14 is similar to FIG. 13 except that the magnet used to generate the FIG. 14 data is a sandwich magnet in which the center element is an inverted bar magnet (not a tee and not merely a pole piece) also set-back 1.5 mm.

FIG. 14 is similar to FIG. 13 except that the magnet used to generate the FIG. 14 data is a sandwich magnet in which the center element is an inverted bar magnet (not a tee and not merely a pole piece) also set-back 1.5 mm.

Although the physics which allows the present invention to achieve its unexpected beneficial result is not entirely understood, the following model provides an effective tool for designing versions of the present invention and predicting how they will function. This model is based on the magnetic "circuit" model.

Figure 15:
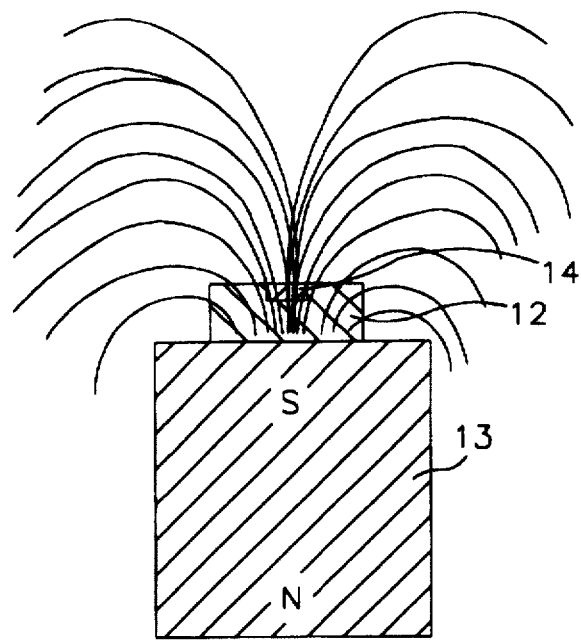
FIG. 15 shows a single-pole Hall-effect gear tooth sensor 10 of the type known in the prior art.

FIG. 15 shows a single-pole Hall-effect gear tooth sensor of the type known in the prior art. The cylindrical permanent magnet 13 has flat ends at its N and S poles. A Hall-effect sensor 14 is mounted on the S pole end. The sensing plane of the sensor is perpendicular to the N-S-axis of the magnet. Because the Hall-effect sensor 14 measures the component of magnetic flux density perpendicular to the sensing plane of the sensor, and because the lines of magnetic flux trace from infinity and then gather together and enter the S pole of the magnet, parallel to the magnet axis, the sensor detects a very high (large absolute value) negative magnetic flux in the normal configuration, and with no ferromagnetic material in the sensing field, as shown in FIG. 15. Thus, the base line signal generated by the Hall-effect sensor has a relatively high absolute value. It is designated as position A on the Hall signal chart of FIG. 25 which shows the absolute value of the Hall signal.

The configuration shown in FIG. 15 may be viewed as a situation in which the ferromagnetic object to be sensed is positioned at infinity from the sensor.

PIG. 16 shows a diagrammatic representation of a gear 11 which is moved into a position somewhat remote from the sensor and with the gear teeth positioned on either side of the sensor so that the sensor is sensing the space between the teeth. The existence of the ferromagnetic gear within the magnetic flux field causes the flux to gather and concentrate slightly toward the N-S-axis of the magnet. The result is that the magnetic flux which is sensed by the sensor is increased. This position, designated position B in FIG. 25, is shown as an increased Hall signal. Because the base signal which would be created by position A as shown in FIG. 15 is relatively high, the relatively small increase in signal in position B shown in FIG. 16 provides a relatively small signal-to-noise ratio.

Figure 16:
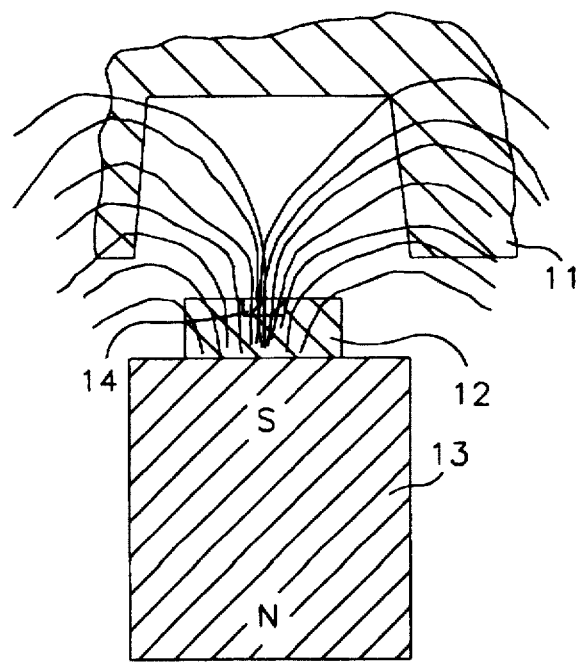
FIG. 16 shows a diagrammatic representation of a gear which is moved into a position somewhat remote from the sensor shown in FIG. 15 and with the gear teeth positioned on either side of the sensor so that the sensor is sensing the space between the teeth.
Figure 17:
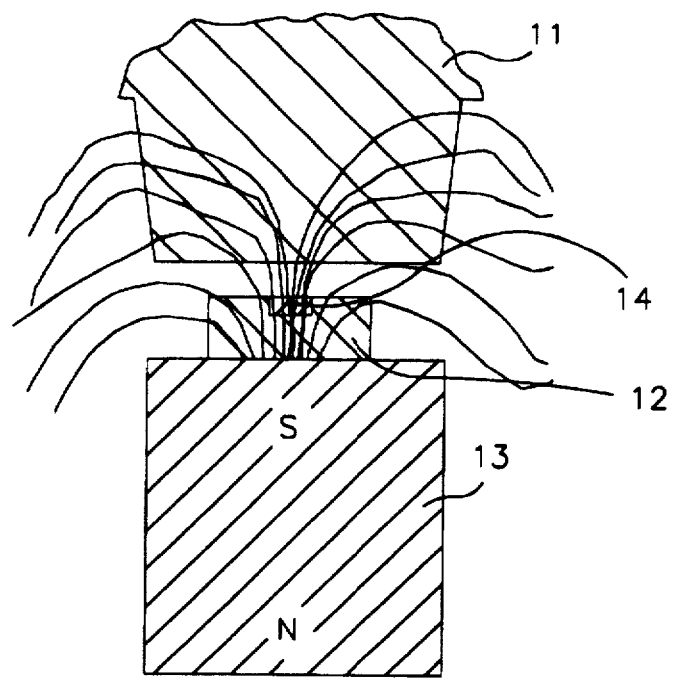
FIG. 17 shows the sensor and gear of FIG. 16 in which the gear is rotated to bring the tooth to its closest position on the path of rotation.

As the gear which is positioned as shown in FIG. 16 is rotated to bring the tooth to its closest position on the path of rotation, as shown in FIG. 17, the flux lines are even more significantly gathered and the flux density perpendicular to the Hall sensor is increased even more. This position is shown in position D of FIG. 25.

Figure 18:
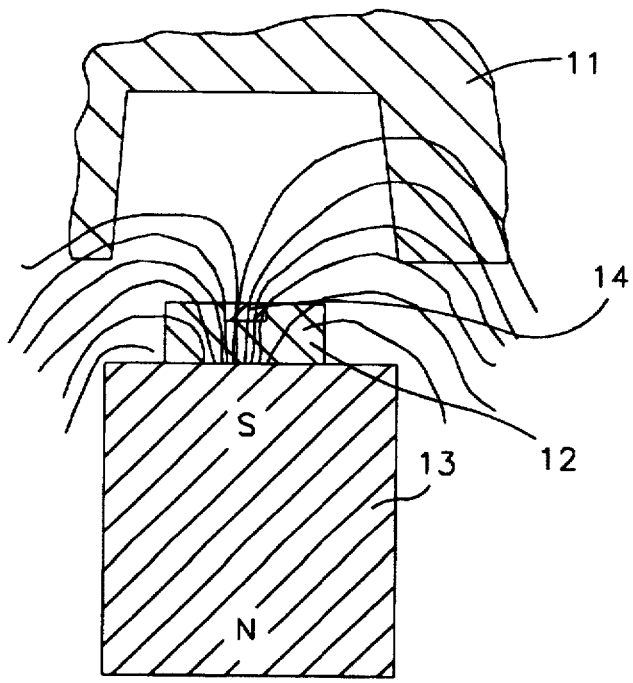
FIG. 18 shows a gear which is positioned even closer to the sensor than that in FIG. 16.

FIG. 18 shows a gear which is positioned even closer to the sensor. This position of the sensor causes a gathering of the flux lines intermediate between position B and position D shown in FIGS. 15 and 16 respectively. This is shown as position C in FIG. 25.

Figure 19:
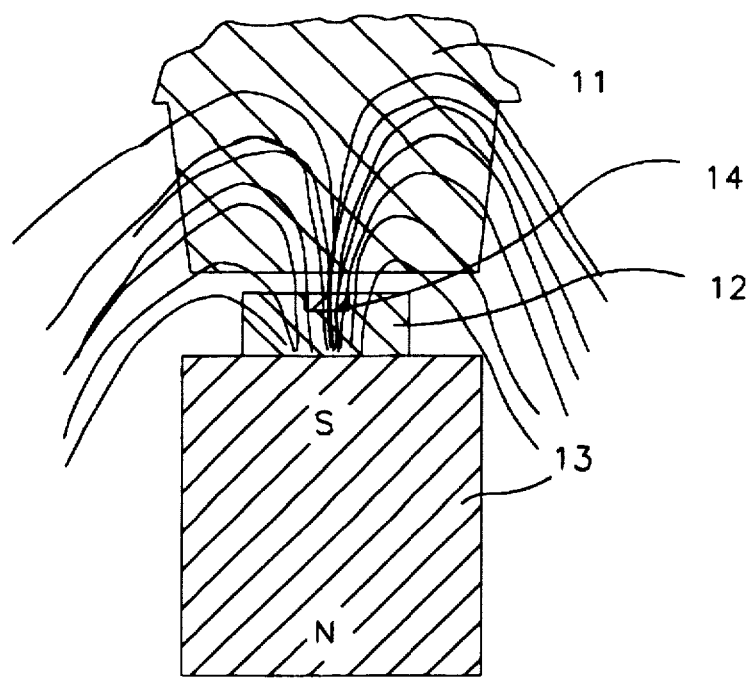
FIG. 19 shows the rotation of the gear shown in FIG. 18 so that the gear tooth is in its closest position to the sensor.

FIG. 19 shows the rotation of the gear shown in FIG. 18 so that the gear tooth is in its closest position to the sensor. This orientation of the tooth and magnet pole focuses the maximum amount of flux directly through the sensor and therefor provides the highest Hall signal.

Because all of the signals generated by positions B, C, D, and E are relatively small compared to the base signal which is found at position A, the signal-to-noise ratio of the signal generated as the gear rotates in front of the sensor is relatively low. As a result, the air gap between the gear tooth and the sensor becomes extremely critical to the reliable operation of the gear tooth sensor.

Figure 20:
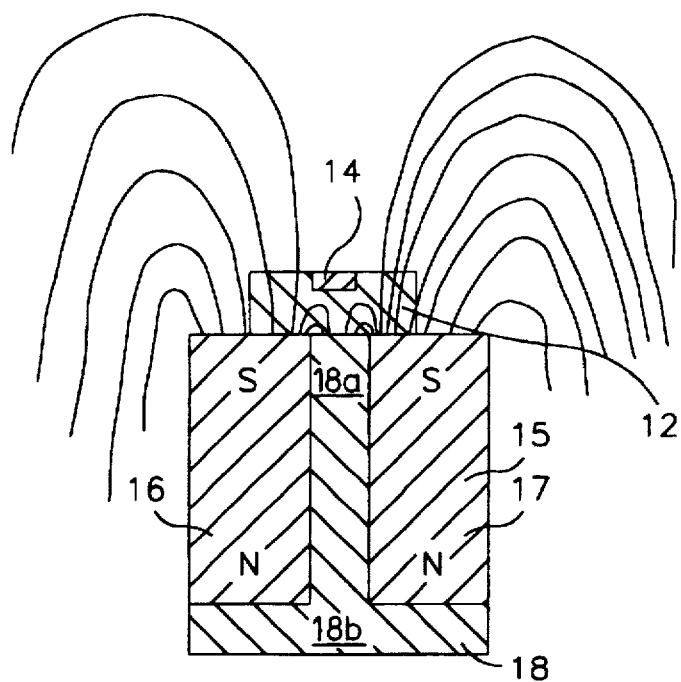
FIG. 20 shows a diagrammatic view of the present invention as it corresponds to the prior art structure shown in FIG. 15.

FIG. 20 shows a diagrammatic view of the present invention as it corresponds to the prior art structure shown in FIG. 15. In FIG. 20, the magnetic face upon which the Hall sensor 14 is mounted is shown as a compound structure 15. This class of compound magnets is sometimes referred to as "holding" magnets because they very strongly hold ferromagnetic objects in contact with them. The magnetic structure shown in FIGS. 20-24 is constructed of two standard S-N bar magnets 16 and 17 mounted in parallel upon a ferromagnetic pole piece 18 having a T-shaped cross section. Because the magnets induce a magnetic field in the pole piece, the portion 18a of the pole piece adjacent and between the S ends of the magnet becomes a virtual N pole. Therefore, the magnet acts as if there were an N pole between the two S poles. As shown in FIG. 20, the effect of this magnet geometry is to cause a "short circuit" of the magnetic flux lines so that, instead of radiating outward from the magnet face to infinity along the magnet axis, the flux lines adjacent the axis tend to travel in a highly concentrated form from the N pole of the pole piece to each S poles.

The part 18 b of the center pole piece that extends outward and covers the back ends of the magnet elements is called a back plate. It can be a part of the center pole piece or it can be a separate pole piece. It can also be used when the center element is a permanant magnet. The relevant effect of the back plate is to increase the forward reach of the magnetic field in front of the magnet structure and, thereby, to increase the range of the sensor.

As can be seen in FIG. 20, the flux lines which are near the axis of the magnet and Hall element, from the N pole of the pole piece to each of the S poles are highly concentrated very close to the end surface of the magnet and essentially travel radially outward from the N pole and the axis of the magnet, and parallel to the plane of the Hall sensor, to the S poles. As a result, although there is a very high magnetic flux density very close to the surface of the magnet, the density at the Hall element is very significantly reduced or almost nonexistent. Furthermore, because the Hall sensor only senses the component of magnetic flux which is normal to the plane of the Hall element, the Hall sensor effectively senses no magnetic flux in the novel configuration shown in FIG. 20. This corresponds to tooth position F in FIG. 25 or a situation where the ferromagnetic object to be sensed is at infinity. The Hall signal approaches zero.

Figure 21:
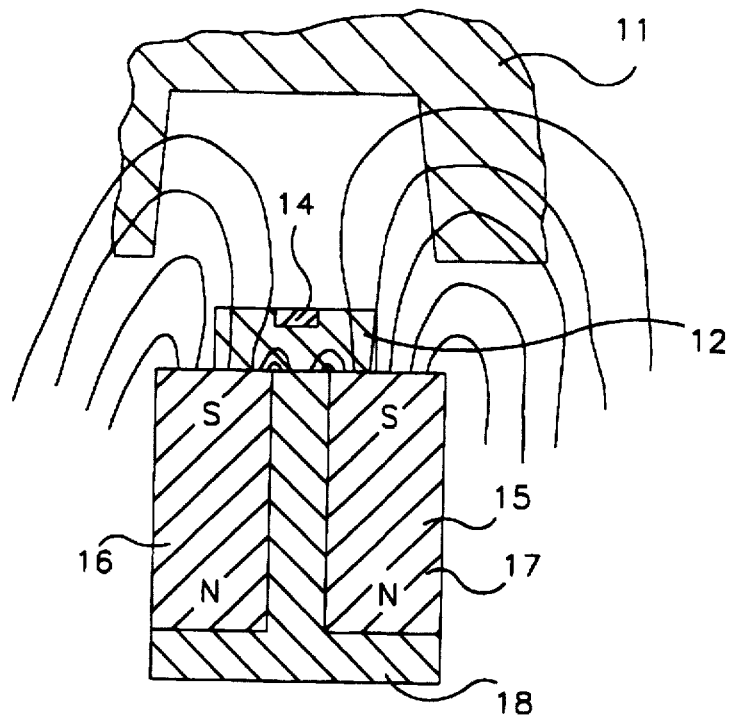
FIG. 21 shows the effect of moving the gear to be sensed into a relatively remote position from the sensor.

FIG. 21 shows the effect of moving the gear 11 to be sensed into a relatively remote position from the sensor. Because the flux density in the present invention resides so close to the face of the magnet, the presence of the gear with its tooth straddling the sensor has almost no effect on the sensor. This position, shown as position G in FIG. 25 has a small or almost no effect on the Hall signal.

Figure 22:
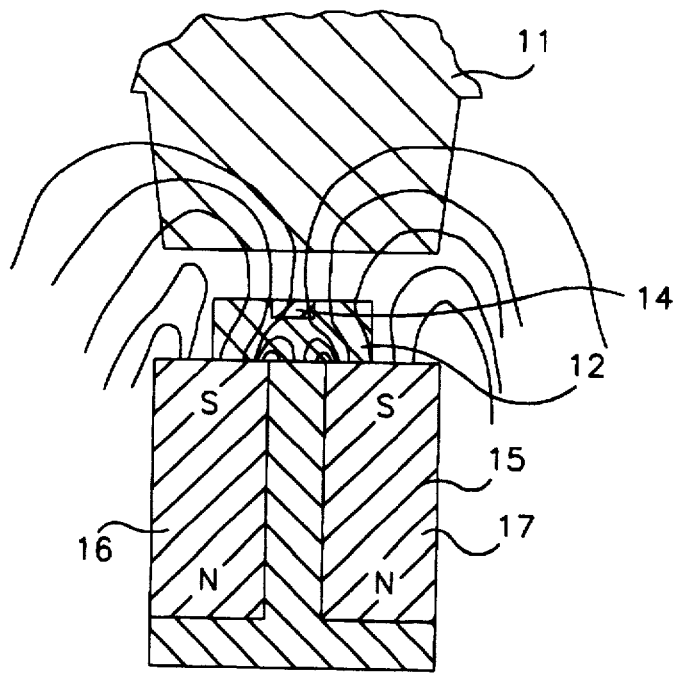
FIG. 22 shows the effect when the gear shown in FIG. 21 is rotated to bring the tooth adjacent the sensor.

FIG. 22 shows the effect when the gear shown in FIG. 21 is rotated to bring the tooth adjacent the sensor. This position is shown as position I in FIG. 25. As can be seen, the near position of the gear tooth draws the magnetic flux, which enters the S poles, axially inward and concentrates the flux lines near the axis of the magnet and the Hall element. As a result, a substantial number of flux lines actually pass through the Hall element and have significantly components perpendicular to the plane of the Hall element. As a result, the signal which is generated in position I is substantially above the inter-tooth position of position G in absolute value, that is, in the S-N-S configuration, a more negative value.

Figure 23:
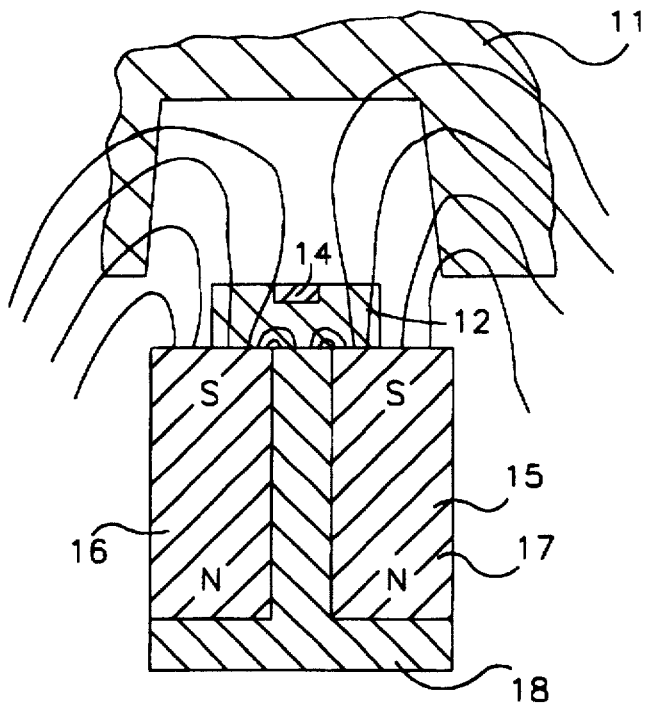
FIG. 23 shows an arrangement in which the gear, although still in the inter-tooth position, is placed even closer to the sensor than the arrangements shown in FIGS. 21 and 22.

FIG. 23 shows an arrangement in which the gear, although still in the inter-tooth position, is placed even closer to the sensor than the arrangements shown in FIGS. 21 and 22. As with the other inter-tooth position shown in FIG. 21, the presence of the gear in its inter-tooth orientation is not sufficient to axially concentrate or draw significant numbers of flux lines through the Hall element. As a result, as designated by position H in FIG. 25, there is no significant increase in signal with this orientation.

Figure 24:
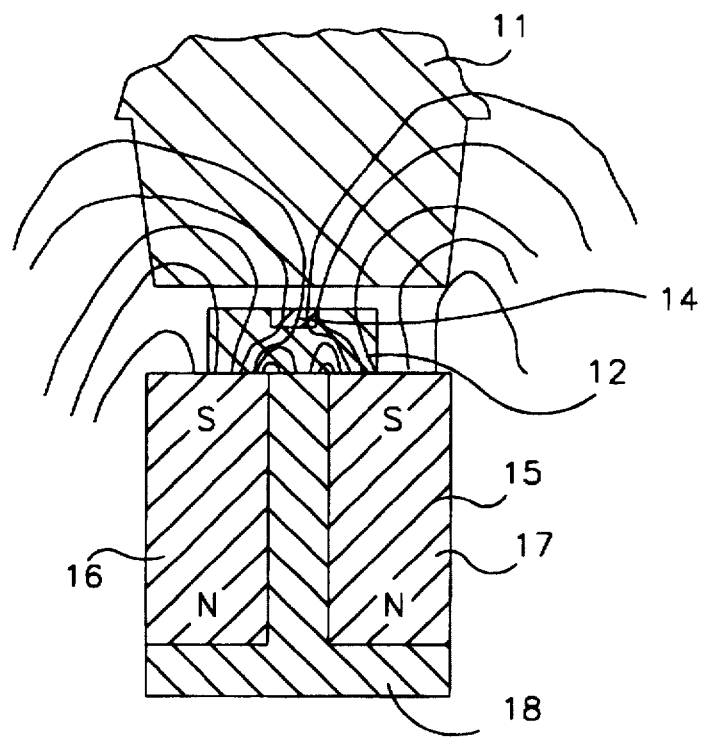
FIG. 24 shows a position in which the rotation of the gear positioned in FIG. 23 moves the tooth closest to the sensor.

FIG. 24 shows a position in which the rotation of the gear positioned in FIG. 23 moves the tooth closest to the sensor. As can be seen in FIG. 24, the effect of the ferromagnetism of the gear axially concentrates or draws a very large amount of the flux and the flux lines through the Hall sensor. Because of the substantial density of the flux through and normal to the plane of the sensor, the signal set out in FIG. 25 as generated by position J 1.5 mm. FIG. 24, is relatively strong (very negative), particularly with respect to the inter-tooth signal of position H. Furthermore, it is relatively strong compared to the base line position in position F and therefore the signal-to-noise ratio of the arrangement is relatively large.

Figure 41:
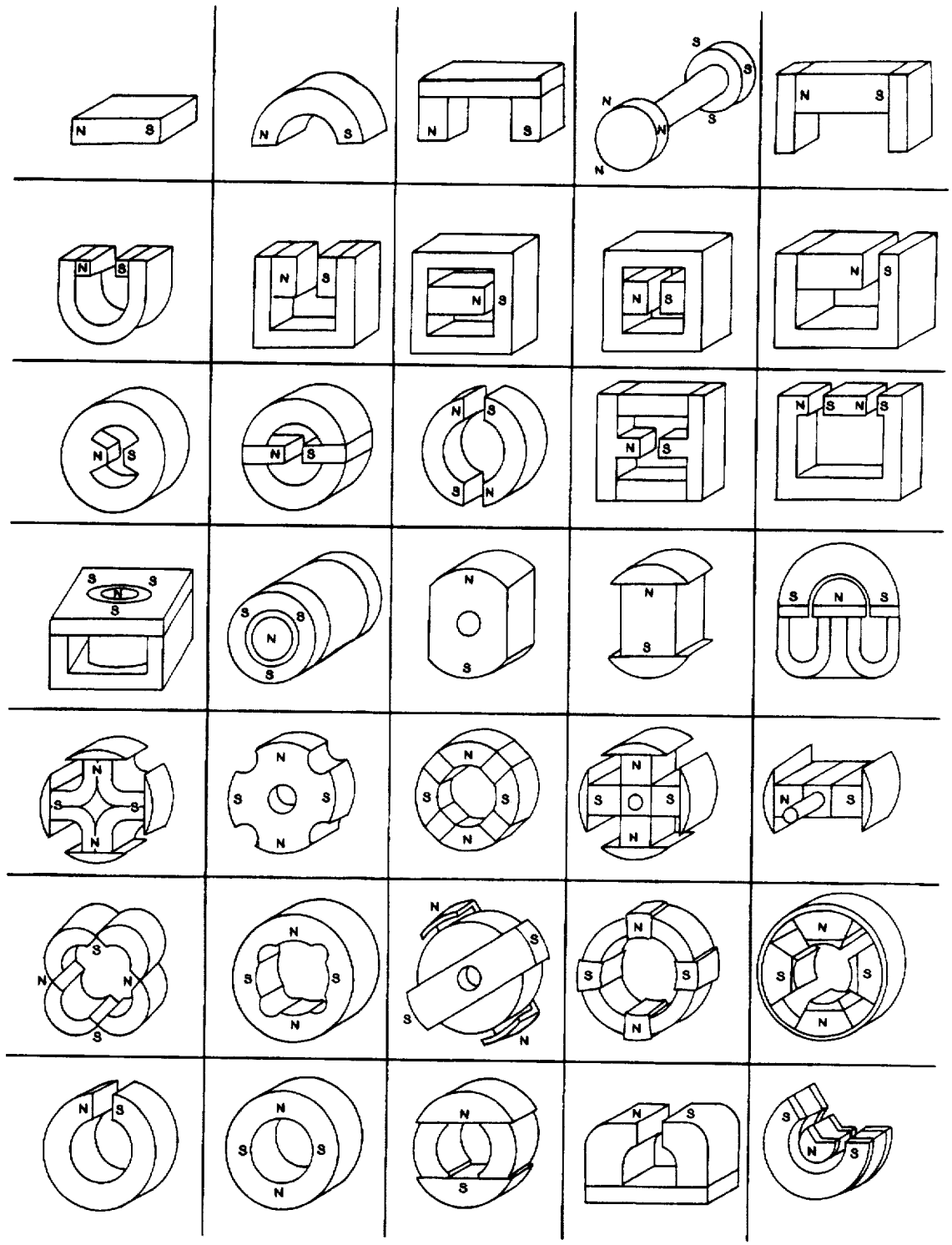
FIG. 41 is a series of perspective views of magnet structures which present multiple poles to a single face.

FIGS. 26–41 present a series of magnet structures which embody the principles of the present invention in that they present at least two different poles to a single face. FIG. 26 is a perspective view of a magnet structure which includes four magnetized poles and one face. FIG. 27 is a perspective view of a magnet structure which includes two poles, one face, and steel back plate. FIG. 28 is a perspective view of a magnet structure which includes four poles, one face with steel back plate. FIG. 29 is a perspective view of a magnet structure which includes a pole parallel to thickness with steel back plate and center pole. FIG. 30 is a perspective view of a magnet structure which includes a pole parallel to thickness with steel cup. FIG. 31 is a perspective view of a magnet structure which includes a pole parallel to thickness with steel cup and center pole. FIG. 32 is a perspective view of a magnet structure which includes three alternated magnets with steel back plate. FIG. 33 is a perspective view of a magnet structure which includes a pole parallel to thickness with steel angle. FIG. 34 is a perspective view of a magnet structure which includes a pole parallel to thickness with steel channel. FIG. 35 is a perspective view of a magnet structure which includes poles parallel to thickness with two steel side plates. FIG. 36 is a perspective view of a magnet structure which includes two magnetized poles and one face (through). FIG. 37 is a perspective view of a magnet structure which includes three magnetized poles and one face (through). FIG. 38 is a perspective view of a magnet structure which includes two magnetized poles and one face (through), with a steel back plate. FIG. 39 is a perspective view of a magnet structure which includes two magnets with steel back plate. FIG. 40 is a perspective view of a magnet structure which includes three magnetized poles and one face (through), with a steel back plate. FIG. 41 is a series of perspective views of a magnet structures which present multiple poles to a single face.

Figure 42:
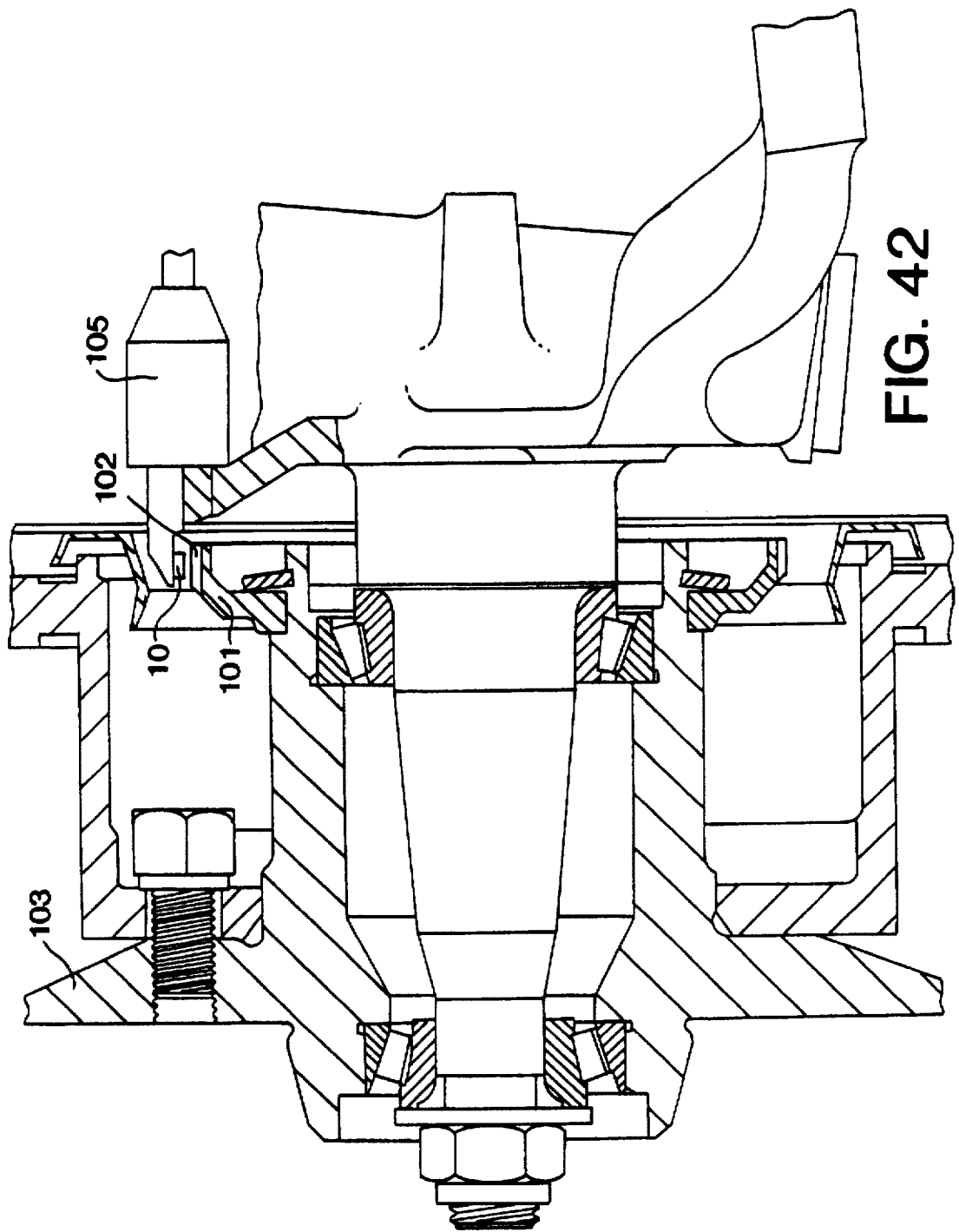
FIG. 42 is a sectional view of an application environment in which the sensor package of the present invention can be employed, and more specifically, the figure shows the wheel axle end of an automobile.

FIG. 42 shows a sensor package 10 of the present invention in a typical application situation. In this case, the sensor package 10 is positioned with its front surface facing the outer periphery of a toothed gear wheel 101 having teeth 102. The gear wheel 101 is coaxial with and connected to an axle mounted wheel of a vehicle so that the rotation of the wheel 103 of the vehicle is proportional to the rotation of the gear 101. The sensor package 10 is able to monitor the passage of the gears before the face of the sensor 10 and produce an electrical signal related to the speed at which the teeth are passing the sensor 10. The electrical signal is processed in a signal processor 105 which, in turn, passes the signal to the user in a form suitable for use. For example, the sensor can be used to determine the speed of a vehicle, to determine engine speed, and to control the firing of spark plugs by monitoring the position of a cam within a distributor.

Figure 43:
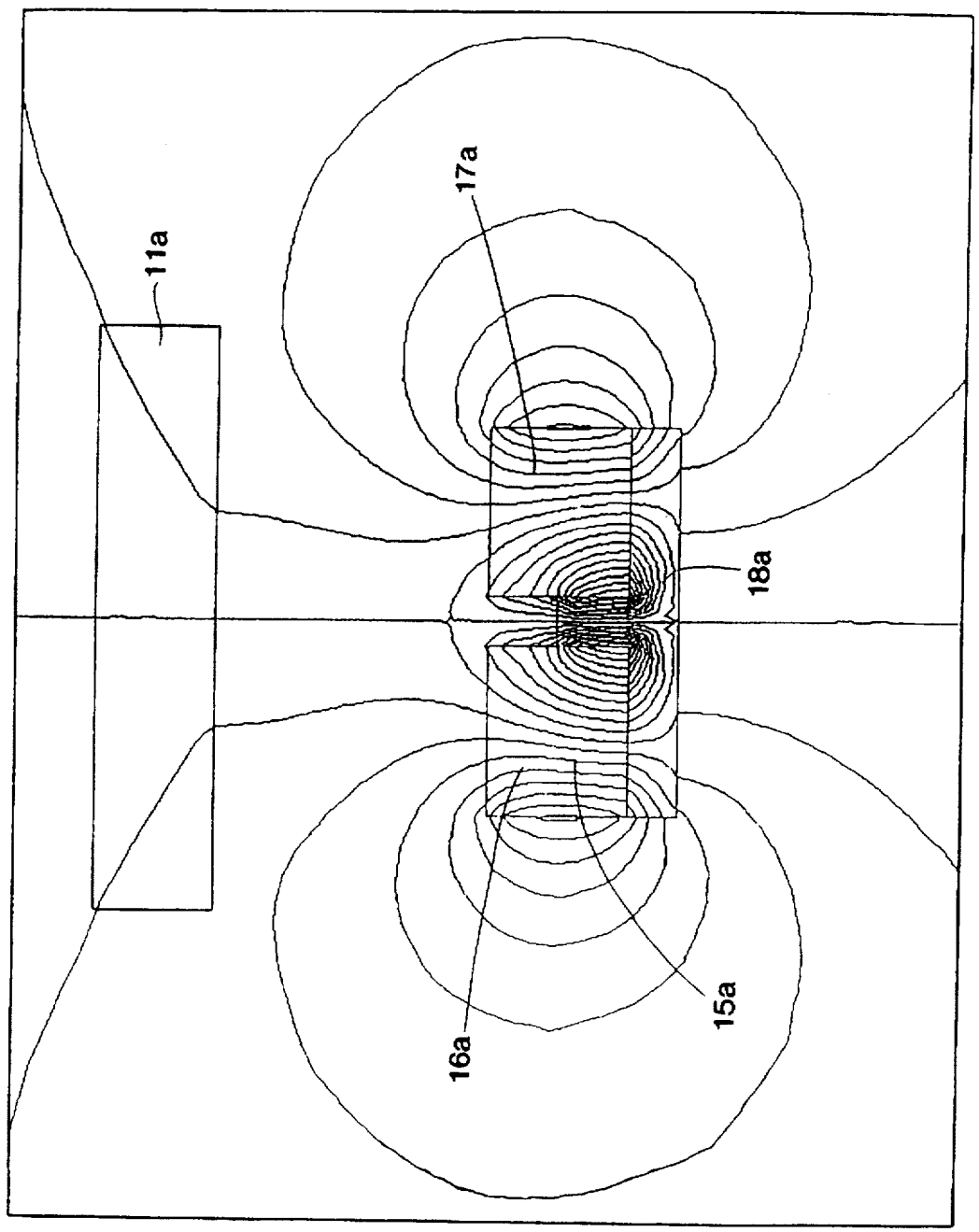
FIG. 43 is a computer model of the effect of a rectangular ferromagnetic target 11a on the magnetic field around a magnet structure 15a embodying the principles of the present invention.

FIG. 43 is a computer model of the effect of a rectangular ferromagnetic target 11a on the magnetic field around a magnet structure 15a embodying the principles of the present invention. The magnet structure 15a has two magnets 16a and 17a, and a T-shaped pole piece 18a which has a center piece and a back plate. The center piece is back set from the front face (toward the target) of the magnet structure.

Figure 44:
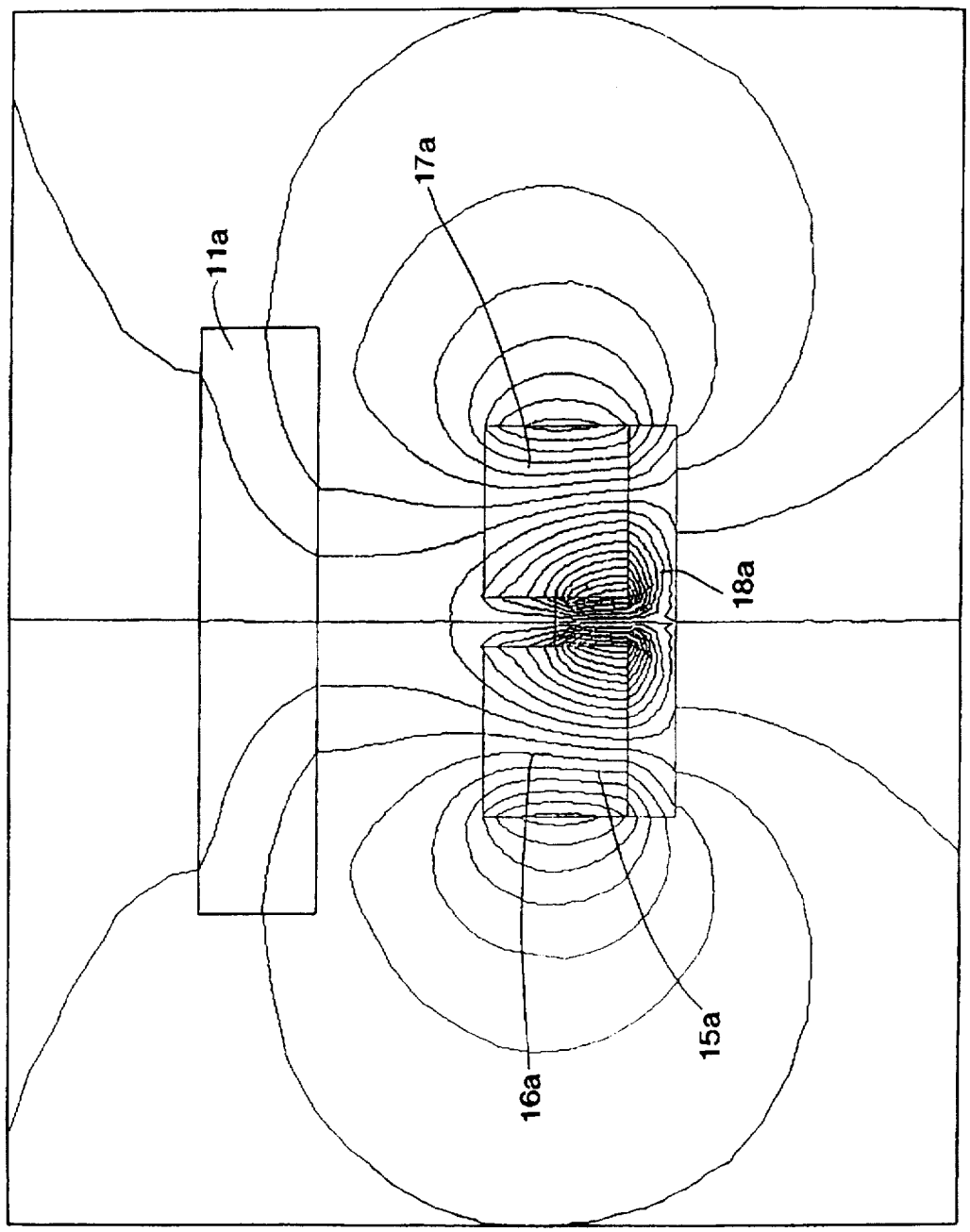
FIG. 44 corresponds to FIG. 43 and shows how the movement of the target 11a toward the magnet structure causes the flux lines between the target and the magnet structure to concentrate axially inward.

FIG. 44 corresponds to FIG. 43 and shows how the movement of the target 11a toward the magnet structure causes the flux lines between the target and the magnet structure to concentrate axially inward. A Hall element on the axis and between the target and the magnet structure would see greater flux density as the target moves toward the magnet structure. This model supports the explanation that the no-target magnetic field has a magnetic "neutral zone" along the magnet axis and forward of the fringing field near the front face of the magnet structure. A magnetic field sensor placed in this "neutral zone" would sense little or no magnetic flux when no target is present, but would sense flux when the longitudinal flux lines are drawn axially inward through the sensor by the presence of the target.

Figure 45:
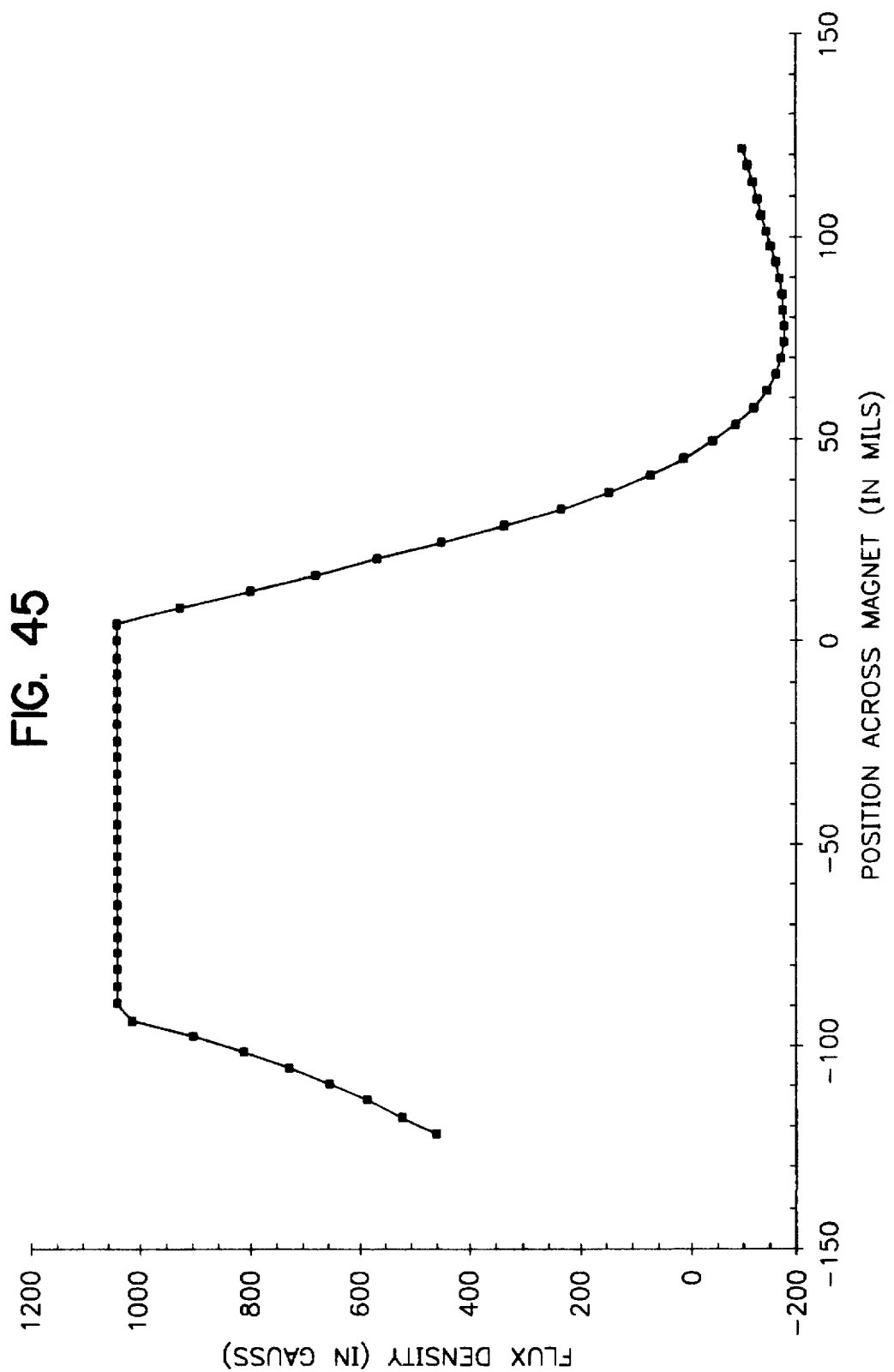
FIG. 45 shows the flux density across the face of a magnet structure which presents only one N and one S pole to the back of the sensor chip.

As discussed above, an alternate magnet structure can be selected which presents only one N and one S pole to the back of the sensor chip. FIG. 45 shows the flux density across the face of a magnet structure which presents only one N and one S pole to the back of the sensor chip.

Figure 46:
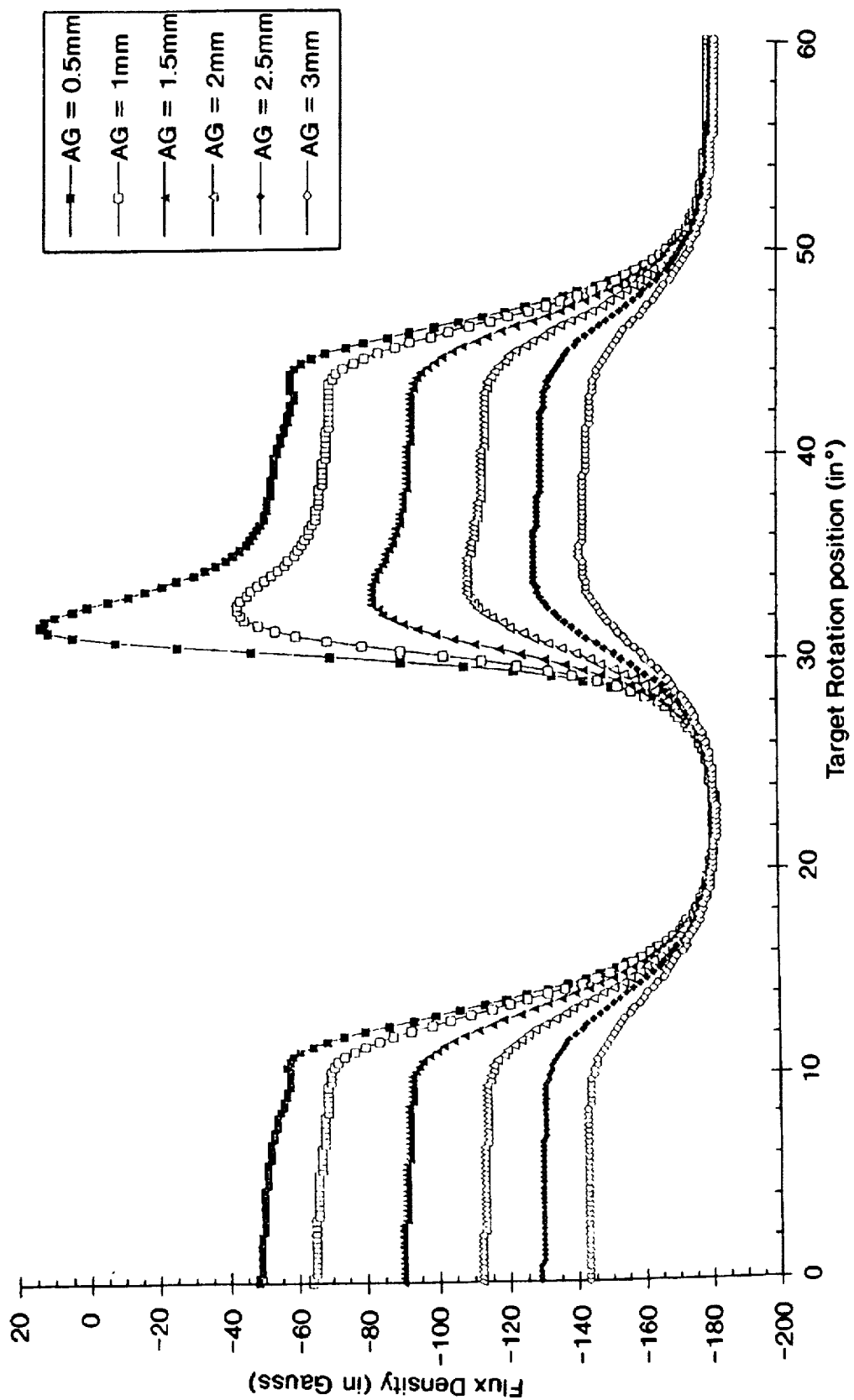
FIG. 46 shows the gear passing signal produced by the magnet structure shown in FIG. 45.

FIG. 46 shows the gear passing signal produced by the magnet structure shown in FIG. 45. This is inferior to the three pole structures, but is usable and can be less expensive to produce.

Although this description has focused on the use of a Hall element is the magnetic flux detector, the concept of the present invention can be applied to a substitute for the Hall element called a magneto-resistive element. The features of the type of device are set out in FIG. 47. Use of the magneto-resistive element is this invention would require recognition of the differences between the two devices, and in particular the recognition that the Hall device is a voltage-difference device that senses flux normal to its plane, whereas the magneto-resistive element is a resistance device that senses flux parallel to the plane of the device and normal to current flow.

It is obvious that minor changes may be made in the form and construction of the invention without departing from the material spirit thereof. It is not, however, desired to confine the invention to the exact form herein shown and described, but it is desired to include all such as properly come within the scope claimed.

The invention having been thus described, what is claimed as new and desire to secure by Letters Patent is:

1. A magnetic-field sensor for detecting the presence of passing ferromagnetic articles comprising:

a) an integrated circuit chip 12 including a magnetic field sensor element 14 for generating an output voltage that is proportional to the ambient magnetic field; and b) a magnet structure comprised of a central pole piece 18, a first high magnetic permeability pole piece 16 abutting one side of said magnet 18 and a second high magnetic permeability pole piece 17 abutting the opposite side of said magnet 18. an end of each of at least said first and second pole pieces lying in and defining said front face 15f of said magnet structure 15. said central pole piece being for presenting a magnetic field of one polarity at said front face and said first and second pole pieces being respectively for presenting magnetic fields of the opposite polarity at said front face. said sensor element being centrally mounted to said magnet structure at said front face:

so that the absolute value of magnetic flux sensed by said magnetic-sensor element is low when there is no passing ferromagnetic article in the vicinity of said sensor element. a high amplitude of flux is sensed by said magnetic-field sensor element at moments when a ferromagnetic article is proximate said magnetic-field sensor element and at moments when the valley between two passing ferromagnetic articles is proximate said magnetic-field sensor element a low value magnetic flux is sensed that is almost independent of the air gap dimension between said sensor element and the passing articles.

2. The magnetic-field sensor of claim 1 wherein said central pole piece 18 is a permanent magnet.

3. The magnetic-field sensor of claim 1 wherein said first and second ferromagnetic high magnetic permeability pole pieces 16 and 17 each consist of a permanent magnet.

4. The magnetic-field sensor of claim 1 wherein said first and second pole pieces are each magnets.

5. The magnetic-field sensor of claim 1 wherein said magnetic field sensor element 14 is a planar Hall element.

6. The magnetic-field sensor of claim 5 wherein said front face 15f of said magnet structure is parallel to the plane of said sensor 14. and said magnet structure 15 includes at least one permanent magnet 18.

7. The magnetic-field sensor of claim 1 wherein one end of said central pole piece is recessed from said front face 15f of said magnet structure.

8. The magnetic-field sensor of claim 1 wherein said sensor element is centered between said first and second pole pieces.

9. The magnetic-field sensor of claim 1 additionally comprising a back-side ferromagnetic pole piece part 18b abutting the opposite ends of said first, second and central pole pieces 16. 17 and 18.

10. A magnetic-field sensor for detecting the presence of passing ferromagnetic articles comprising:

a) an integrated circuit chip 12 including a magnetic field sensor element 14 for generating an output voltage that is proportional to the ambient magnetic field; and b) a magnet structure 15 comprising:

1) a central magnetic pole piece (18) and two peripheral magnetic pole pieces (16 and 17) respectively abutting two opposite sides of said central magnetic pole piece. a pole end of each of said two peripheral pole pieces coincident with a front face 15f of said magnet structure (15). one pole end of said central magnetic pole piece lying between said peripheral pole-piece ends near said front face. said integrated circuit chip 12 being mounted centrally to said magnet-structure front face; and 2) a magnet means for generating a magnetic field of one polarity at said one pole end of said central magnetic pole piece. and for generating magnetic fields of the other polarity at said pole ends of said two peripheral magnetic pole pieces;

so that the absolute value of magnetic flux sensed by said magnetic-sensor element is low when there is no passing ferromagnetic article in the vicinity of said sensor element. a high amplitude of flux is sensed by said magnetic-field sensor element at moments when a ferromagnetic article is proximate said magnetic-field sensor element. and at moments when the valley between two passing ferromagnetic articles is proximate said magnetic-field sensor element a low value magnetic flux is sensed that is almost independent of the air gap dimension between said sensor element and the passing articles.

11. The magnetic-field sensor of claim 10 wherein said two pole ends of said two peripheral pole pieces lie in and define said front face 15f of said magnet structure.

12. The magnetic-field sensor of claim 10 wherein said front face 15f of said magnet structure is parallel to the plane of said sensor 14.

13. The magnetic-field sensor of claim 10 wherein said magnet means is comprised of said central magnetic pole piece. and said central magnetic pole piece is a permanent magnet.

14. The magnetic-field sensor of claim 10 wherein said integrated circuit chip 12 is centrally located with respect to and is adjacent to said one pole end of said central magnetic pole piece (18).

* * * * *